(12) United States Patent
Weinfurtner

(10) Patent No.: US 6,269,049 B1
(45) Date of Patent: Jul. 31, 2001

(54) METHOD AND APPARATUS FOR A FLEXIBLE CONTROLLER INCLUDING AN IMPROVED OUTPUT ARRANGEMENT FOR A DRAM GENERATOR SYSTEM

(75) Inventor: Oliver Weinfurtner, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/533,526

(22) Filed: Mar. 23, 2000

Related U.S. Application Data
(60) Provisional application No. 60/079,717, filed on Mar. 27, 1998.

(51) Int. Cl.[7] ........................................... G11C 8/00
(52) U.S. Cl. .............................. 365/233; 365/239
(58) Field of Search ........................ 365/233, 239

(56) References Cited

U.S. PATENT DOCUMENTS 5,301,278 * 4/1994 Bowater et al. .................. 365/233
5,933,385 * 8/1999 Jiang et al. ....................... 365/239

* cited by examiner

*Primary Examiner*—Trong Phan
(74) *Attorney, Agent, or Firm*—Stanton C. Braden

(57) ABSTRACT

In a controller for controlling a generator system on a memory chip, the controller operates as a state machine in accordance with a state diagram including a plurality of X states. A state storage device is responsive to input signals indicating a change in the state diagram from a current state to a next state for generating a revised plurality of X state output signals comprising a true State signal and a complementary true State signal for the next state of the plurality of X states. An output arrangement is responsive to the true State signal and the complementary true State signal in the revised plurality of X state output signals from the state storage device for generating separate predetermined ones of M output signals associated with said next state for controlling the generator system while providing substantially zero current consumption when the state diagram reaches a final state of the plurality of X states.

20 Claims, 14 Drawing Sheets

METHOD AND APPARATUS FOR A FLEXIBLE CONTROLLER INCLUDING AN IMPROVED OUTPUT ARRANGEMENT FOR A DRAM GENERATOR SYSTEM

CROSS-REFERENCE TO RELATED APPLICATIONS

This application is related to and drawn from Provisional Application Ser. No. 60/079,717, filed Mar. 27, 1998, and U.S. patent application Ser. No. 09/253,996, filed Feb. 22, 1999, and having the same inventor and assignee.

This application is also related to co-pending applications entitled "Method and Apparatus For A Flexible Controller For A DRAM Generator Controller", "Method and Apparatus For An Improved Reset And Power-On Arrangement For A DRAM Generator Controller", and "Method and Apparatus For An Easy Identification Of A State Of A DRAM Generator Controller" which are filed on the same date as the present application, and have the same inventor and assignee.

FIELD OF THE INVENTION

The invention relates to an improved output matrix for use in a controller for a generator system in a Dynamic Random Access Memory (DRAM) that is very flexible, and the functionality of which can be easily adjusted to the generator system and permit quick "last-minute-changes" in the controller's behavior.

BACKGROUND OF THE INVENTION

Modern DRAM chips have many different voltages (e.g., more than 10) on-chip that have to be generated by a plurality of generator circuits. These voltages include several reference voltages (e.g., for receiver circuits and for bias current generation) as well as several voltages that supply various functional blocks on the chip with operating current (e.g., voltages for sense amplifiers and word line drivers). All of these voltages are generated from one external source voltage by the plurality of generator circuits.

There are basically three operating modes which occur for the voltage generating circuits. These modes are (1) a normal operating phase, (2) a test and burn-in phase, and (3) a power-on phase. In each of these modes the generator system operates in a different way, and needs to be controlled in a specific way. A controller for the generator system has to ensure a proper coordination of all generator functions for each of the various modes. More particularly, once the external source voltage (VEXT) is applied to the DRAM chip, the generator system goes through a power-on phase. After the power-on phase, all voltages on the DRAM chip are stable, and the generator system (and the whole chip) enters the normal operating phase. For burn-in and for test purposes, a multitude of additional functions have to implemented into the generator system.

The problem is that the overall logic behavior of the generator system, and its controller, is relatively complex. This is especially true during a late phase of a design project as all of the sub-systems are being put together, and it is very likely that changes in the logic functionality of the controller have to be made. In a current one-Gigabit (GB) chip, known by the designation ZEUS DD1, logic control functions of a generator system therein were clearly separated from the voltage generating functions. The logic behavior of the generator system is implemented in a digital controller (a finite state machine). In order to realize a finite state machine, design and layout synthesis was used in the 1 GB Dynamic Random Access Memory (DRAM) chip. The logic behavior therein was specified in a truth table, and the concept was to create circuitry automatically within a short time by using the respective software tools. Thus, changes or corrections of the controller could theoretically be performed within a few hours, even in a late stage of a project.

Problems in existing solutions are that both design and layout synthesis tools do not provide a required solution to many problems for providing a flexible and fast controller design. For example, the design synthesis tool demanded a large amount of time for learning the handling and functionality of the tool, and this tool made manual corrections and working around of problems necessary. The layout synthesis tool created results that contained errors and required manual inspections and corrections. Additionally, one could not provide timing constraints to inputs to the tool for generating certain voltages which required manual checks of a synthesized layout for a critical path which then required manual corrections. Therefore, it is desirable to provide a technique where changes in the logic behavior of the controller is obtainable in a systematic and very quick manner.

The present invention provides a controller circuit for a generator system that is very flexible so that its functionality can easily be adjusted to a specific generator system to allow for last minute changes of the behavior of a generator circuit.

SUMMARY OF THE INVENTION

The present invention is directed to an output matrix for use in a controller for a generator system located on a chip such as a Dynamic Random Access Memory (DRAM). The specific behavior of the present controller and its output matrix is made very flexible so that its functionality can easily be adjusted to the specific associated generation system and permit quick "last-minute-changes" in the controller's behavior. Still further, the arrangement of the output arrangement is such that the current (bias) consumption is substantially zero during a "sleep" mode of the Controller.

Viewed from one aspect, the present invention is directed to a controller for controlling a generator system on a memory chip. The controller operates as a state machine in accordance with a state diagram including a plurality of X states. The controller comprises a state storage device and an output arrangement. The state storage device is responsive to input signals indicating a change in the state diagram from a current state to a next state of the plurality of X states for generating a revised plurality of X state output signals comprising a true State signal and a complementary true State signal for the next state of the plurality of X states. The output arrangement is responsive to the true State signal and the complementary true State signal in the revised plurality of X state output signals from the state storage device for generating separate predetermined ones of M output signals associated with said next state. The output signals are used for controlling the generator system, and the output arrangement provides substantially zero current consumption when the state diagram reaches a final state of the plurality of X states.

Viewed from another aspect, the present invention is directed to a controller for controlling a remote system on a memory chip which operates in accordance with a state diagram including a plurality of X states. The controller comprises an evaluation arrangement, a state storage device, and an output arrangement. The evaluation arrangement is responsive at any instant of time for evaluating only one of a plurality of N input signals to the controller from remote devices in relation to only one of a plurality of X state signals. When a condition has been met wherein the one state signal and the one input signal have met predetermined logical conditions the evaluation arrangement generates one of a plurality of Y output signals that has a predetermined logical value for entering a next state in the state diagram. The state storage device is responsive to the one of a plurality of Y output signals having a predetermined logical value from the evaluation arrangement for generating a revised plurality of X state output signals comprising a true State signal and a complementary true State signal for the next state of the plurality of X states. Te true State signal is transmitted back to the evaluation arrangement indicating a change in the state diagram from a current state to a next state of the plurality of X states. The output arrangement is responsive to the true State signal and the complementary true State signal of the revised plurality of X state output signals from the state storage device for generating separate predetermined ones of M output signals associated with said next state for controlling the generator system. The output arrangement has a configuration that provides substantially zero current consumption when the state diagram reaches a final state of the plurality of X states.

Viewed from still another aspect, the present invention is directed to a method for controlling a generator system on a memory chip with a controller operating as a state machine in accordance with a state diagram including a plurality of X states. In a first step of the method, a revised plurality of X state output signals are generated comprising a true State signal and a complementary true State signal for a next state of the plurality of X states in a state storage device in responsive to input signals indicating a change in the state diagram from a current state to the next state of the plurality of X states. In a second step of the method, separate predetermined ones of output signals associated with said next state are generated for controlling the generator system in an output arrangement. The output arrangement is responsive to both the true State signal and the complementary true State signal in the revised plurality of X state output signals from the state storage device generated in the first step while providing substantially zero current consumption when the state diagram reaches a final state of the plurality of X states in the state diagram.

The invention will be better understood from the following more detailed description taken with the accompanying drawings and claims.

DETAILED DESCRIPTION

In the various figures, corresponding designation numbers represent corresponding elements.

Figure 1:
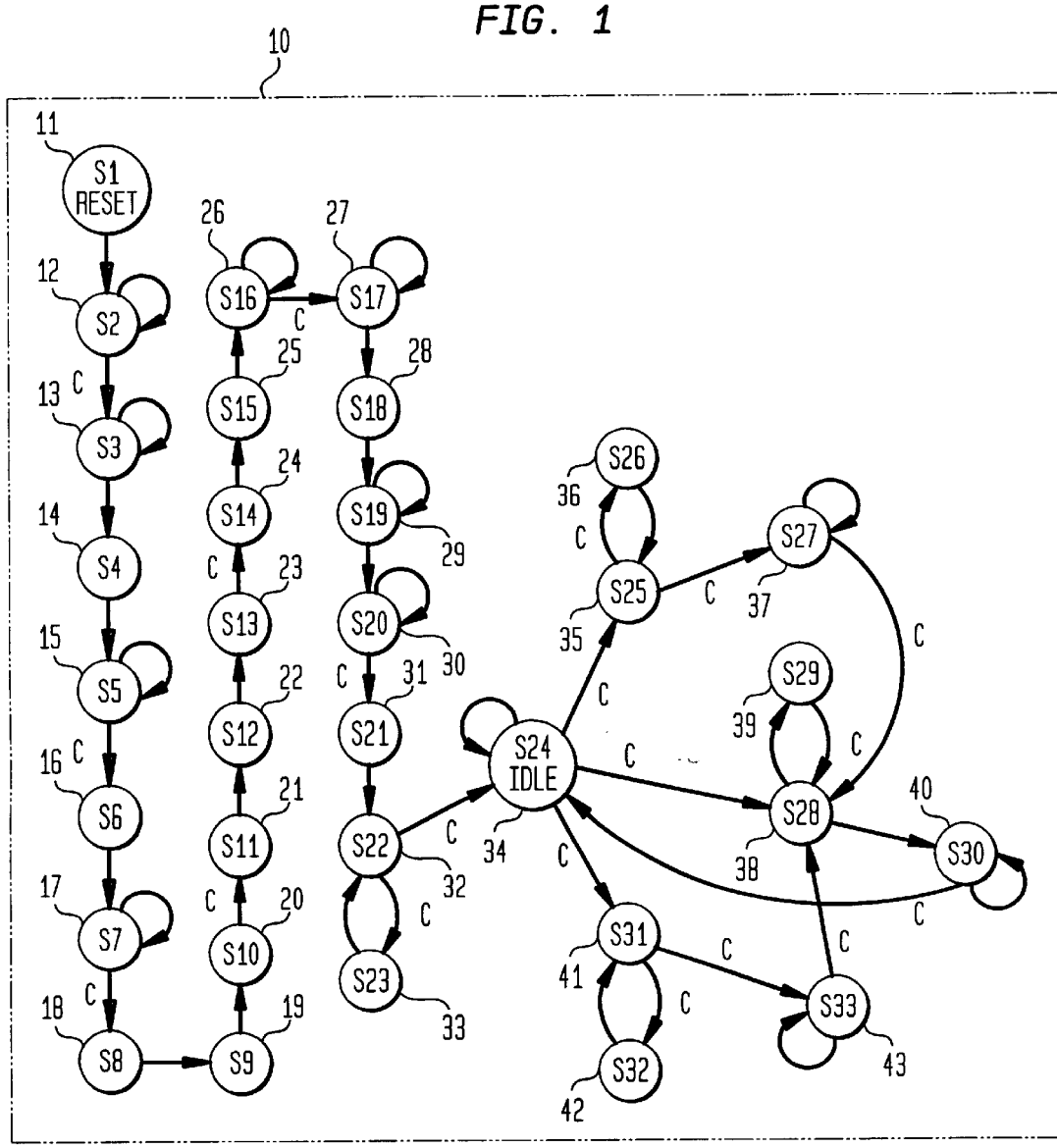
FIG. 1 is a general type of state diagram of a generator controller for use by a state machine of a generator controller to control a generator system of, for example, a prior art one-Gigabit (GB) Dynamic Random Access Memory (DRAM) chip.

Referring now to FIG. 1, there is shown a general type of state diagram 10 (shown within a dashed line rectangle) for use by a state machine of a generator controller to control a generator system (not shown) of, for example, a prior art 1-Gigabit (GB) Dynamic Random Access Memory (DRAM) chip (not shown). The state diagram 10 is shown as comprising a plurality of thirty-three states designated S1–S33 indicated within circles 11–43, respectively. It is to be understood that the state diagram 10 is exemplary only, and that state machines can have any logical behavior and routing through a state diagram depending on the generator system to be controlled. Therefore, a state diagram can have any number of states arranged in a predetermined sequence to permit a state machine to achieve a proper control sequence of each operational mode of a generator system on an associated DRAM chip. In the state diagram 10, each of the states S1–S33 indicates a state wherein a certain function is performed, and a "C" at an output of a particular state indicates that a predetermined Condition must occur for a transition out of that state.

In a typical operation, when an external supply voltage is powered up and supplied to the DRAM chip, the state machine is forced into a RESET state as indicated for state S1 within circle 11. After the state machine is initialized in state S1, the state machine generally goes into a Power-Up mode and proceeds through a sequence of states S2 to S24 shown by circles 12–34, respectively. The Power-Up mode sequence through states S2–S24, for example, coordinates a sequential turning-on of all generator subsystems (not shown). More particularly, as the state machine proceeds through the state diagram 10, predetermined ones of the states S2–S24 will turn-on one or more of the generator subsystems within the generator system (not shown). All conditional transitions in the state diagram 10 are marked with a "C" next to a transition arrow leading out of that state. The "C" indicates that the state machine stays in the respective state until one (or more) input signal (not shown) take on a required value as, for example, an input signal is in a "low" (typically a "0") or a "high" state (typically a "1"), or the input has reached at a specified threshold level. Only then does the transition to a next state occur.

Once in the Reset state S1 shown in circle 11, an unconditional transition occurs into state S2 shown by circle 12 since no condition "C" is shown at the output of state S1. In state S2 shown by circle 12, the sequence of the state diagram 10 remains in state S2 until a specific condition "C" occurs as is indicated at the output of state S2. Once the condition "C" is detected by the state machine, the state machine proceeds to state S3 shown by circle 13. The output of state S3 does not have a required input signal condition before transitioning to state S4 shown by circle 14 and, may, for example, just cause a predetermined delay. State S4 also does not have a Condition for a transition into state S5 shown by circle 15 and may, for example, turn on a predetermined generator in the generator system. As the state machine proceeds through the state diagram 10, it generates, for example, 20 output signals (not shown) which have specific values by which it controls the generator sub-systems. At the end of the Power-Up mode sequence, the state machine stays in an IDLE mode indicated by state S24 shown by circle 34. When certain test or configuration operations need to be performed, the state machine transits through some or all of the respective sequences of states S25–S33 indicated by circles 35–43, respectively, and the path directions as is required by each operation, and then returns to the IDLE mode at state 24 shown by circle 34.

Although there are some variations to the structure of a state diagram from design to design, and although added functionality is likely to be expected for further projects, state diagram 10 can be regarded as fairly typical for application to a generator controller in a DRAM chip. The typical state diagram 10 is characterized by the following aspects. First, the state diagram has a linear structure over large portions of the diagram which indicates that most states have only one predecessor state and only one successor state. Second, when successor branching occurs (more than one potential successor to a state), then there are, in most cases, not more than two potential successor states. Third, when predecessor branching occurs, then there are, in most cases, not more that two potential predecessors to each state. Fourth, most conditional (C) transitions between two states depend on one input variable. Fifth, the state diagram 10 generally has forty to sixty states, ten to twenty input signals, and twenty to twenty-five output signals.

To enable implementation of a universally programmable state machine in accordance with the present invention, the state machine needs to comprise very basic building blocks and predetermined transformations in the state diagram. The basic structure of such state machine only allows the implementation of (a) states with only one exit condition (C) which means that in every state only one input signal can be evaluated with the consequence that every state can have only one conditional successor, and (b) states that have no more than two predecessors.

Figure 2:
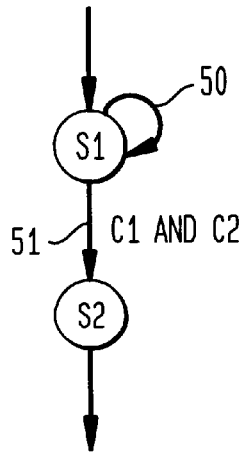
FIGS. 2 and 3 show separate exemplary arrangements of a partial state diagram for a transition from a first state to a second state on two logically AND-combined input variables.
Figure 3:
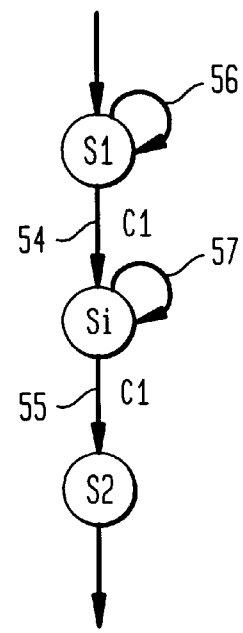

Referring now to FIGS. 2 and 3, there is shown separate exemplary arrangements of a partial state diagram for a transition from a first state S1 to a second state S2 on two logically AND-combined input variables (not shown). In FIG. 2, within the state S1 an evaluation of each of first and second input variables is made and only when each of the first and second variables obtain a predetermined condition C1 AND C2, respectively, will there be a transition 51 from state S1 to state S2. Until such predetermined condition of C1 AND C2 exists, state S1 continuously re-evaluates the conditions of the first and second input variables, as is indicated by the loop 50, until the state machine detects that the input variables thereto meet the predetermined condition of C1 AND C2. Then a transition to state S2 is performed.

In FIG. 3, the arrangement of FIG. 2 is transformed into a sequence of two transitions where a first transition 54 is from state S1 to an intermediate state Si, and a second transition 55 is from state Si to a state S2. In this arrangement, each transition 54 or 55 depends on only one input variable (not shown) meeting only one condition. More particularly, a first input variable is provided to state S1 where it is continuously evaluated, as is indicated by loop 56, until it meets a predetermined condition C1 (e.g., the input variable is high). At this time there is a transition in the state diagram to state Si. State Si continuously evaluates, as is indicated by loop 57, a second input variable until that second variable meets a predetermined condition C2 (e.g., the input variable is high). At this time there is a transition from state Si to state S2. In each of FIGS. 2 and 3, the transition to state S2 requires that both conditions C1 AND C2 exist before a transition is made to state S2. The difference between FIGS. 2 and 3 is that the implementation of the hardware in the associated state machine is different where the arrangement of FIG. 3 is a simple hardware implementation.

Figure 4:
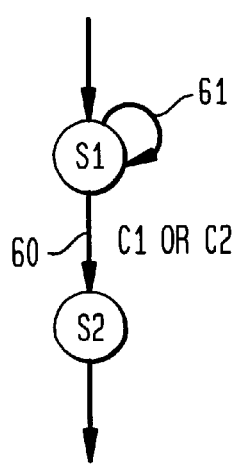
FIGS. 4 and 5 show separate exemplary arrangements of a partial state diagram for a transition for a first state to a second state on two logically OR-combined input variables.
Figure 5:
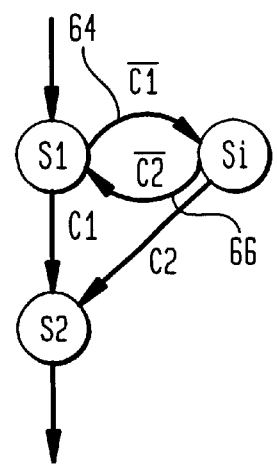

Referring now to FIGS. 4 and 5, there is shown separate exemplary arrangements of a partial state diagram for a transition for a first state to a second state based on two logically OR-combined input variables. In FIG. 4, in state S1 an evaluation of each of first and second variables (not shown) is made. When the first or second variable obtains a predetermined condition of C1 OR C2, respectively, a transition 60 from state S1 to state S2 occurs. Until such predetermined condition of C1 OR C2 exists, state S1 continuously re-evaluates the conditions of the first and second variables, as is indicated by the loop 61, until state S1 finds that the input variables meet the predetermined condition of C1 OR C2.

In FIG. 5, the arrangement of FIG. 4 is transformed into an arrangement of three states S1, Si, and S2 wherein a parallel evaluation of first and second input variables (not shown) is performed. State S1 evaluates the first input variable to determine if a condition C1 is met by the first input variable, and state Si evaluates the second input variable to determine if a condition C2 is met by the second input variable. In operation, state S1 initially determines whether the condition C1 is met, and if condition C1 is met the state machine immediately goes to state S2. If condition C1 is not met in state S1, an inverted C1 signal is sent to state Si via path 64 to cause state Si to evaluate the second input variable to determine if the second input variable meets the condition C2. If condition C2 is met in state Si, the state machine transitions to state S2. If condition C2 is not met, control is returned via path 66 from state Si to state S1. This cycling between states S1 and Si repeats until either one of the conditions C1 OR C2 is met. This transformation principle shown in FIG. 5 can be extended to more than two OR-combined input variables by the inclusion of more intermediate states in parallel with states S1 and Si. Under such arrangement, the state machine would cycle through all of the intermediate states (states S1, Si, etc) until one input variable meets its stated condition "C" before transitioning to state S2. The difference between FIGS. 4 and 5 is that the implementation of the hardware in the associated state machine is different and simpler for the arrangement of FIG. 5.

Figure 6:
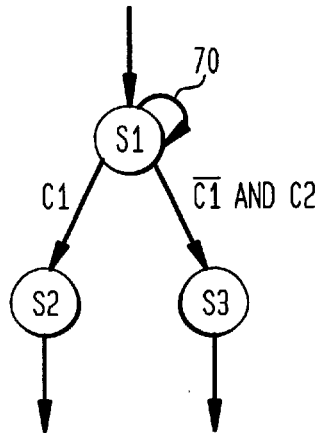
FIGS. 6 and 7 show separate exemplary state transitions in a partial state diagram for a conditional branching from a first state into two potentially successor second and third states.
Figure 7:
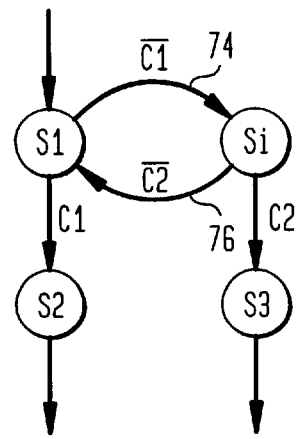

Referring now to FIGS. 6 and 7, there is shown separate exemplary state transitions in a partial state diagram for a conditional branching from a first state S1 into two potentially successor second and third states S2 and S3. In FIG. 6, state S1 evaluates first and second input variables (not shown), and if the first input variable meets a condition C1, the state machine transitions to state S2. If the first input variable does not meet the condition C1 and the second input variable meets a condition C2, the state machine transitions from state Si to state S3. If both of the first input variable and the second input variables do not meet the condition of C1 and C2, respectively, then state S1 loops through the sequence again as is indicated by the loop 70 until a condition C1 or C2 is met to transition either to state S2 or state S3, respectively.

In FIG. 7, the arrangement of FIG. 6 is transformed into an arrangement of four states S1, Si, S2, and S3 wherein a parallel evaluation of two input variables (not shown) are performed. In operation, state S1 initially determines whether a condition C1 is met, and if condition C1 is met the state machine immediately transitions to state S2. If condition C1 is not met in state S1, an inverted C1 signal is sent to state Si via path 74 to cause state Si to evaluate the second input variable to determine if the second input variable meets a condition C2. If condition C2 is met, the state machine then transitions to state S3. If condition C2 is not met, control is returned via path 76 from state Si to state S1. The cycling between states S1 and Si repeats until either one of the conditions C1 or C2 is met. This transformation principle can be extended to more than two potential successor states by the addition of more intermediate states (Si) in parallel. In such arrangement, the state machine would cycle through all of the intermediate states Si until one of the more than two input variables would meet its condition (C) before the state machine goes into the respective successor state.

Figure 8:
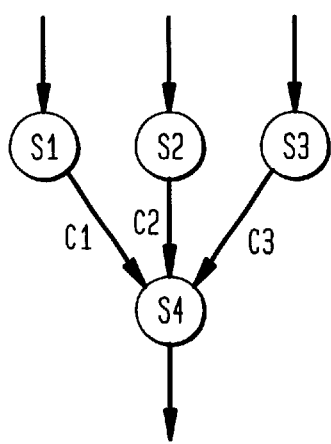
FIGS. 8 and 9 show separate exemplary state transitions in a partial state diagram where three states have a common successor state.
Figure 9:
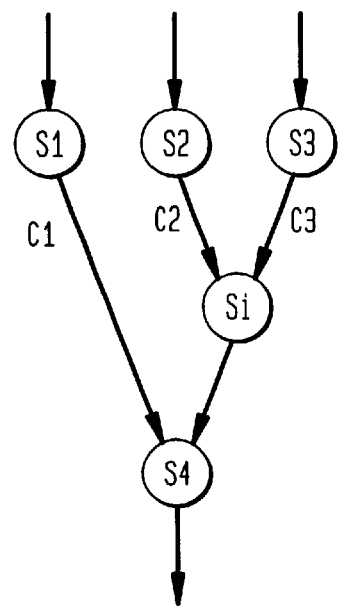

Referring now to FIGS. 8 and 9, there is shown separate exemplary state transitions in a partial state diagram where three states S1, S2, and S3 have a common successor state S4. In FIG. 8, first, second, and third input variables (not shown) are evaluated in parallel by states S1, S2, and S3, respectively. If State S1 determines that the first input variable meets a condition C1, the state machine transitions directly to state S4. Similarly, if state S2 or S3 determines that the second or third input variable, respectively, meets a respective condition C2 or C3, the state machine transitions directly to state S4.

In FIG. 9, the arrangement of FIG. 8 is transformed into an arrangement of five states S1, S2, Si, S3, and S4. A parallel evaluation of first, second, and third input variables is performed in states S1, S2, and S3. In operation, state S1 initially determines whether a condition C1 is met, and if condition C1 is met the state machine immediately transitions to state S4. State S2 determines whether a condition C2 is met, and if condition C2 is met the state machine immediately transitions to state Si. Similarly, state S3 determines whether a condition C3 is met, and if condition C3 is met the state machine immediately transitions to state Si. The transition from state Si to state S4 occurs unconditionally upon detection of a transition from states S2 and/or S3.

FIGS. 2–8 describe transformations which provide a "universal" state diagram, as is shown in FIGS. 3, 5, 7, and 9, that comprise only a few basic hardware elements. A penalty for these transformations from FIGS. 2, 4, 6, and 8 (which include complex conditions) to FIGS. 3, 5, 7, and 9 (which include sequential simple conditions) is an introduction of one or more intermediate states Si. The advantage of the arrangements of FIGS. 3, 5, 7, and 9 is that they comprise vary basic building blocks which only allow (a) states with only one exit condition (C) which means that in every state only one input signal can be evaluated with the consequence that every state can have only one conditional successor, and (b) states that have no more than two predecessors.

Figure 10:
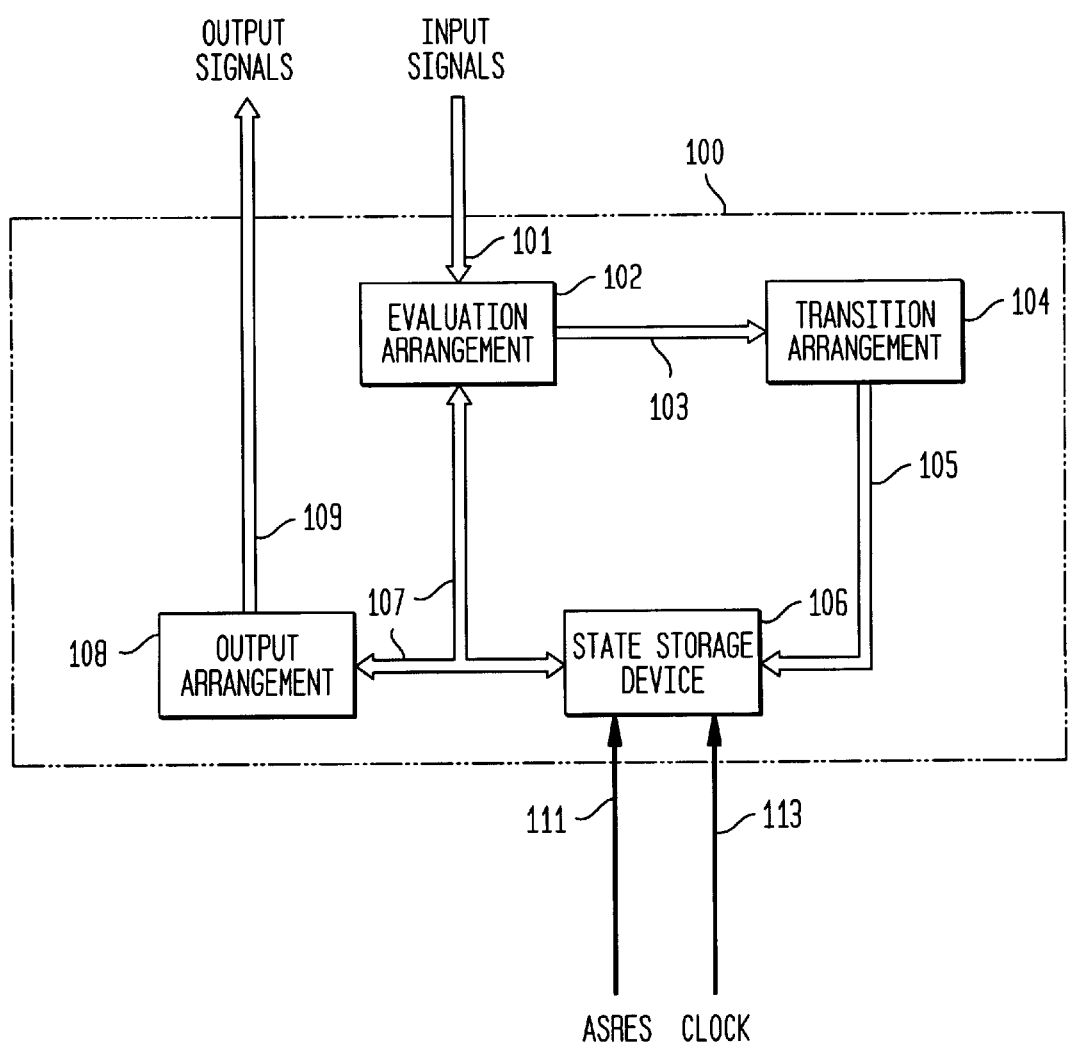
FIG. 10 shows a block diagram of a controller for a generator system of a Dynamic Random Access Memory (DRAM) chip in accordance with the present invention.

Referring now to FIG. 10, there is shown a block diagram of an exemplary controller 100 (shown within a dashed line rectangle) for a generator system (not shown) of, for example, a Dynamic Random Access Memory (DRAM) chip (not shown) in accordance with the present invention. The controller 100 comprises an evaluation arrangement 102, a transition arrangement 104, a state storage device 106, an output arrangement 108, and buses 101, 103, 105, 107, and 109 which are shown by bold lines. Input signals are received by the evaluation arrangement 102 via the bus 101 and the bus 107, and it generates output signals which are transmitted over bus 103 to the transition arrangement 104. The transition arrangement 104, which is responsive to the output signals it receives from the evaluation arrangement 102, generates output signals which are transmitted to the state storage device 106 via bus 105. The state storage device 106 receives as inputs the output signals from the transition arrangement 104 via bus 105, and externally generated Reset and Clock signals via leads 111 and 113, respectively. The state storage device 106 is responsive to the received input signals and generates output signals which are transmitted via bus 107 to inputs of both the Evaluation arrangement 102 and the output arrangement 108. The output arrangement 108 generates output signals which are transmitted via the bus 109 to remote devices such as generators of a generator system. An external power source (not shown) provides a predetermined potential VEXT to the controller 100 via lead 114 for use in the evaluation arrangement 102, the transition arrangement 104, and the output arrangement 108. The operation of the controller 100 will described hereinbelow in regard to FIGS. 11–14.

Figure 11:
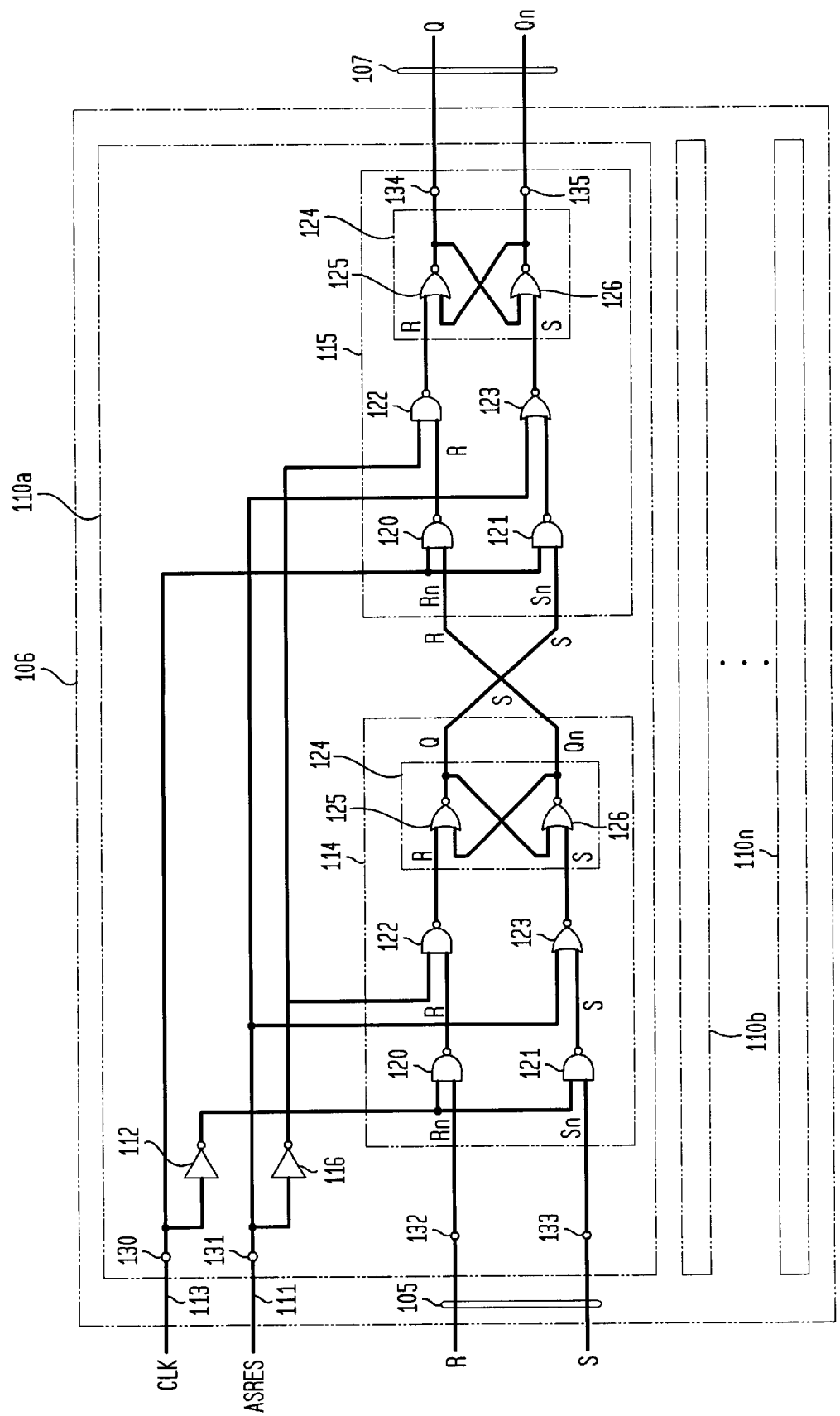
FIG. 11 shows a circuit diagram for one of a plurality of corresponding exemplary Set-Reset-Master-Slave Flip-Flops for use in an exemplary state storage device forming part of the controller of FIG. 10 in accordance with the present invention.

Referring now to FIG. 11, there is shown an exemplary arrangement of a state storage device 106 (shown within a dashed line rectangle) forming part of the controller 100 of FIG. 10 in accordance with the present invention. The state storage device 106 comprises a plurality of N Set-Reset-Master-Slave Flip-Flop (SR-MS-F/F) circuits 110a to 110n (of which only shown only SR-MS-F/F circuits 110a, 110b, and 110n are shown within a separate dashed line rectangle) with asynchronous reset (ASRES). The SR-MS-F/F circuit 110a is enlarged to show a circuit diagram for an exemplary SR-MS-F/F circuit 110 with asynchronous reset (ASRES). The remaining SR-MS-F/F circuits 110b–110n are similarly configured and function in the same manner is described hereinbelow for SR-MS-F/F circuit 110a.

For an understanding of the operation of the controller 100, the number (N) of state signals equals the number of states (S) in a state diagram as shown, for example, in FIG. 1. This means that a 1-out-of-N coding is used for the controller 100, and every state (S) is represented by one bit in a state vector. When a state (S) is active, the associated bit in the state vector for that state is high (logically high) and all of the other bits in the state vector are low (logically low). Each of the N state bits is stored by a separate one of the SR-MS-F/F circuits 110a–110n.

The SR-MS-F/F circuit 110a comprises first and second inverters 112 and 116, and first and second Set-Reset (S-R) flip-flip (F/F) stages 114 and 115 (each shown within a separate dashed line rectangle). Each of the S-R F/F stages 114 and 115 comprises first, second, and third two-input NAND gates 120, 121, and 122, respectively, a two-input NOR gate 123, and a NOR-S-R flip flop 124 (shown within a dashed line rectangle) comprising first and second two-input NOR gates 125 and 126. A clock (CLK) signal is received at an input terminal 130 of the SR-MS-F/F circuit 110a via a lead 113 and coupled to a first input of each of the first and second NAND gates 120 and 121 in the first S-R F/F stage 114 via the first inverter 112, and directly to first inputs of the first and second NAND gates 120 and 121 in the second S-R F/F stage 115. A Reset (R) signal is received at an input terminal 132 of the SR-MS-F/F circuit 110a via bus 105 and coupled to a second input of the first NAND gate 120 in the first S-R F/F stage 114. A Set (S) signal is received at an input terminal 133 of the SR-MS-F/F circuit 110a via bus 105 and coupled to a second input of the second NAND gate 121 in the first S-R F/F stage 114. An Asynchronous Reset (ASRES) signal is received at an input terminal 131 of the SR-MS-F/F circuit 110a via lead 111 and coupled to a first input of the third NAND gate 122 in each of the first and second S-R F/F stages 114 and 115 via the second inverter 116, and directly to a first inputs of the NOR gate 123 in each of the first and second S-R F/F stages 114 and 115. Outputs from the first and second NAND gates 120 and 121 in each of the first and second S-R F/F stages 114 and 115 are coupled to second inputs of the third NAND gate 122 and NOR gate 123, respectively, in the associated first and second S-R F/F stage 114 and 115. Outputs from the third NAND gate 122 and the NOR gate 123 in each of the first and second S-R F/F stages 114 and 115 are coupled to first inputs of the first and second NOR gates 125 and 126 in the associated NOR-S-R flip-flop 124. An output (Q) of the first NOR gate 125 in the NOR-S-R flip flop 124 of the first S-R F/F stage 114 is coupled to a second input of the second NOR gate 126 in the first S-R F/F stage 114, and to a second input of the second NAND gate 121 in the second S-R F/F stage 115. An output (Qn) of the second NOR gate 126 in the NOR-S-R flip-flop 124 of the first S-R F/F stage 114 is coupled to a second input of the first NOR gate 125 in the first S-R F/F stage 114, and to a second input of the first NAND gate 120 in the second S-R F/F stage 115. The output (Q) of the first NOR gate 125 in the NOR-S-R flip-flop 124 of the second S-R F/F stage 115 is coupled to a second input of the second NOR gate 126 in the second S-R F/F stage 115 and to an output terminal 134 from the SR-MS-F/F circuit 110a. The output (Qn) of the second NOR gate 126 in the NOR-S-R flip-flop 124 of the second S-R F/F stage 115 is coupled to a second input of the first NOR gate 125 in the second S-R F/F stage 115, and to an output terminal 135 from the SR-MS-F/F circuit 110a. The "Q" in the outputs of the first NOR gate 125 and second NOR gate 126 in the NOR-S-R flip-flop 124 of the second S-R F/F stage 115 designates the number of an associated State output (e.g., State 0–n) for the SR-MS-F/F circuit 110a–110n. The "n" in the Qn signal in the outputs of the first NOR gate 125 and second NOR gate 126 in the NOR-S-R flip-flop 124 of the second S-R F/F stage 115 designates a complement of the Q State output signal.

In operation, the SR-MS-F/F circuit 110a is asynchronously resettable. When the SR-MS-F/F circuit 110a receives an ASRES signal at input terminal 131 which is high (e.g., a logical "1"), both of the S-R F/F stages 114 and 115 are immediately set to low (e.g., a logical "0"), independently from what is received in the Set and Reset input signals at input terminals 132 and 133 and the clock signal at input terminal 130. This asynchronous reset function is needed in order to ensure proper reset of each of the SR-MS-F/F circuits 110a–110n in the state storage device 106 at the beginning of a power-on mode sequence. When the ASRES input signal is low (logical "0"), the SR-MS-F/F circuit 110a operates as follows. While the clock signal is low, the first S-R F/F stage 114 is controlled by the Set (S) and Reset (R) input signals, but the second S-R F/F stage 115 is locked. The information at the output terminals 134 and 135 of the SR-MS-F/F circuit 110a are static and not dependent on the clock, Reset, or Set input signals. When the clock signal rises from a logical low to a logical high, the first S-R F/F stage 114 is locked and the second S-R F/F stage 115 is opened so that the current value stored in the NOR-S-R flip-flop 124 of the first S-R F/F stage 114 is transferred to the NOR-S-R flip-flop 124 of the second S-R F/F stage 115. A change in the Reset or Set input signals at terminals 132 or 133, respectively, will not affect the values stored in the SR-MS-F/F circuit 110a.

With each of the first and second stages 114 and 115 of the SR-MSF/F circuit 110a comprising a NOR-S-R flip-flop 124, a truth table for the Set (Sn) signal at the input to NAND gate 120 of the S-R F/F stage 114, the Reset (Rn) signal at the input to NAND gate 121 of the S-R F/F stage 114, the Q signal at output terminal 134, and the Qn signal at output terminal 135 of the SR-MS-F/F circuit 110a is shown in Table 1.

TABLE 1

| $S_n$ | $R_n$ | Q OUT | Qn OUT |
|---|---|---|---|
| 0 | 0 | $Q_{n-1}$ | $Qn_{n-1}$ |
| 0 | 1 | 0 | 1 |
| 1 | 0 | 1 | 0 |
| 1 | 1 | (0) | (0) |

The subscripts "$_n$" and "$_{n-1}$" in Table 1 indicate the current state after input/output signals have changed, and a previous state before these signals changed, respectively. More particularly, a current input combination of S=0 and R=0 will not change the output signals Q and Qn. If both S and R become low, then Q and Qn both become low. However, if afterwards both S and R go high at the same time, then Q and Qn can no longer be predicted as indicated by the (0) designation in Table 1. This latter situation has to be avoided in order the maintain a well defined logical behavior of the SR-MSF/F circuit 110a, and in accordance with the present invention, this situation is not able to occur.

Figure 12:
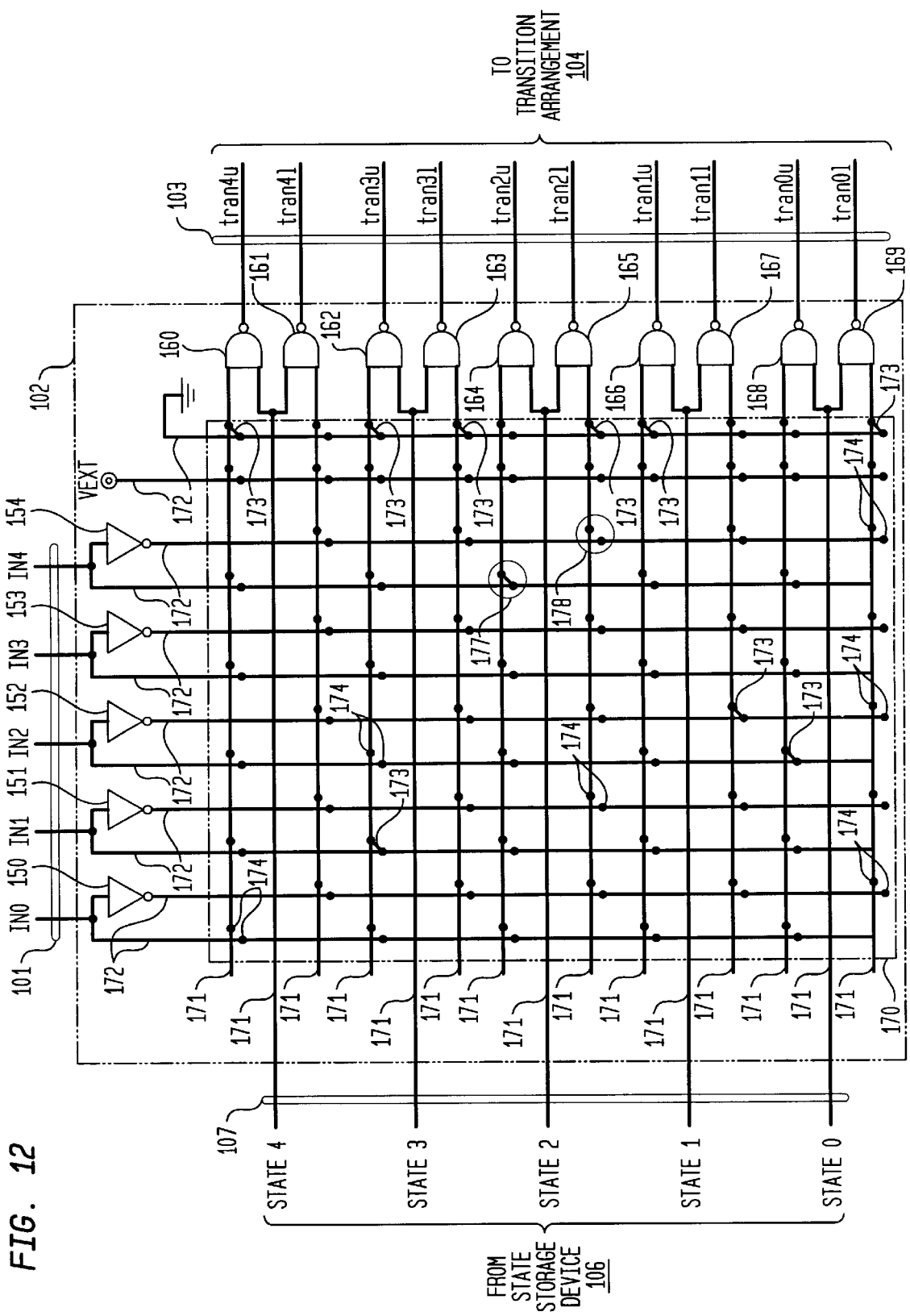
FIG. 12 shows a circuit diagram for an exemplary evaluation arrangement forming part of the controller of FIG. 10 in accordance with the present invention.

Referring now to FIG. 12, there is shown a circuit diagram for an exemplary evaluation arrangement 102 (show within a dashed line rectangle) forming part of the controller 100 of FIG. 10 in accordance with the present invention. The exemplary evaluation arrangement 102 is shown as receiving five state signals State 1–5 signals (State 0–4) and five input variable signals (IN0–IN4) which cause the arrangement to operate as is described hereinbelow. However, it is to be understood that the evaluation arrangement 102 can comprise many more input state and input variable signals that cause the evaluation arrangement 102 to operate in the same manner.

The exemplary evaluation arrangement 102 comprises five inverters 150–154, ten NAND gates 160–169, and a matrix 170 (shown within a dashed line rectangle) comprising fifteen parallel horizontal leads 171 that are connected to predetermined ones of twelve parallel vertical leads 172 by separate permanent connections 173 (shown with a solid line between two associated terminals). Unconnected associated terminals 174 are shown where permanent connections can be made if desired. More particularly, the IN0 input signal is received via bus 101 from a specific remote device (not shown) and coupled to the first vertical lead 172 of the matrix 170 and to the second vertical lead 172 of the matrix 170 by the first inverter 150. The IN1 input signal is received via bus 101 from a separate remote device (not shown) and coupled to the third vertical lead 172 of the matrix 170 and to the fourth vertical lead 172 of the matrix 170 by the second inverter 151. The IN2 input signal is received via bus 101 from a separate remote device (not shown) and coupled to the fifth vertical lead 172 of the matrix 170 and to the sixth vertical lead 172 of the matrix 170 by the third inverter 152. The IN3 input signal is received via bus 101 from a separate remote device (not shown) and coupled to the seventh vertical lead 172 of the matrix 170 and to the eighth vertical lead 172 of the matrix 170 by the fourth inverter 153. The IN4 input signal is received via bus 101 from a separate remote device (not shown) and coupled to the ninth vertical lead 172 of the matrix 170 and to the tenth vertical lead 172 of the matrix 170 by the fifth inverter 154. The eleventh vertical lead 172 is connected to a externally supplied voltage (VEXT), and the twelfth vertical lead 172 is connected to ground which is shown coupled through permanent connections 173 to the first, third, sixth, ninth, tenth, and fifteenth horizontal leads.

The State 4 input signal is received via bus 107 from the State Storage device 106 (shown in FIG. 10) and coupled to the second horizontal lead 171 at a first side of the matrix 170 and to first inputs of the first and second NAND gates 160 and 161 at a second opposite side on the matrix 170. The first and third horizontal leads 171 are connected to second inputs of the first and second NAND gates 160 and 161, respectively. The State 3 input signal is received via bus 107 from the State Storage device 106 and coupled to the fifth horizontal lead 171 at a first side of the matrix 170 and to first inputs of the third and fourth NAND gates 162 and 163 at a second opposite side on the matrix 170. The fourth and sixth horizontal leads 171 are connected to second inputs of the third and fourth NAND gates 162 and 163, respectively. The State 2 input signal is received via bus 107 from the State Storage device 106 and coupled to the eighth horizontal lead 171 at a first side of the matrix 170 and to first inputs of the fifth and sixth NAND gates 164 and 165 at a second opposite side on the matrix 170. The seventh and ninth horizontal leads 171 are connected to second inputs of the fifth and sixth NAND gates 164 and 165, respectively. The State 1 input signal is received via bus 107 from the State Storage device 106 and coupled to the eleventh horizontal lead 171 at a first side of the matrix 170 and to first inputs of the seventh and eighth NAND gates 166 and 167 at a second opposite side on the matrix 170. The tenth and twelfth horizontal leads 171 are connected to second inputs of the seventh and eighth NAND gates 166 and 167, respectively. The State 0 input signal is received via bus 107 from the State Storage device 106 and coupled to the fourteenth horizontal lead 171 at a first side of the matrix 170 and to first inputs of the ninth and tenth NAND gates 168 and 169 at a second opposite side on the matrix 170. The thirteenth and fifteenth horizontal leads 171 are connected to second inputs of the ninth and tenth NAND gates 168 and 169, respectively. The first and second NAND gates 160 and 161 generate Tran4u and tran4l output signals, respectively. Similarly, the third and fourth NAND gates 162 and 163 generate tran3u and tran3l output signals, respectively, the fifth and sixth NAND gates 164 and 165 generate tran2u and tran2l output signals, respectively, the seventh and eighth NAND gates 166 and 167 generate tran1u and tran1l output signals, respectively, the ninth and tenth NAND gates 168 and 169 generate tran0u and tran0l output signals, respectively. The five tran0u–tran4u and the five tran0l–tran4l output signals are transmitted via bus 103 (shown in FIG. 10) to the transition arrangement 104 (shown in FIG. 10).

In operation, it is assumed that at the current moment a state machine in the controller 100 of FIG. 10 is in state 2 (a high on the State 2 lead 171), and that the state 2 shall be exited if the input signal IN4 to the evaluation arrangement 102 is high (e.g. a logical 1). In this case the input signal IN4 is connected via connection 174 (as is shown within the circle 177) to the same NAND gate 164 as the State 2 signal. When the State 2 signal is high, the tran2u output signal from NAND gate 164 will go low (e.g., a logical "0"). This indicates that the state machine is about to exit state 2. If state 2 has to be exited under a condition that the IN4 signal is low, then the negated IN4 signal from inverter 154 would be connected to the NAND gate 165 via a connection (not shown within the circle 178) made between the tenth vertical and ninth horizontal lead of the matrix 170.

For other conditions, a connection (not shown) between the eleventh vertical lead 172 (coupled to the VEXT from the external power supply) and a predetermined one of the NAND gates 160–169 would be made when the state diagram called for an unconditional transfer to that next associated state. A connection between the twelfth vertical lead 172 (coupled to ground) and a predetermined associated pairs of the NAND gates 160–169 associated with a particular state would be made when the state diagram called for a blocked transition, as is shown between the first and third horizontal leads 171 and the twelfth vertical lead 172 for State 4.

Figure 13:
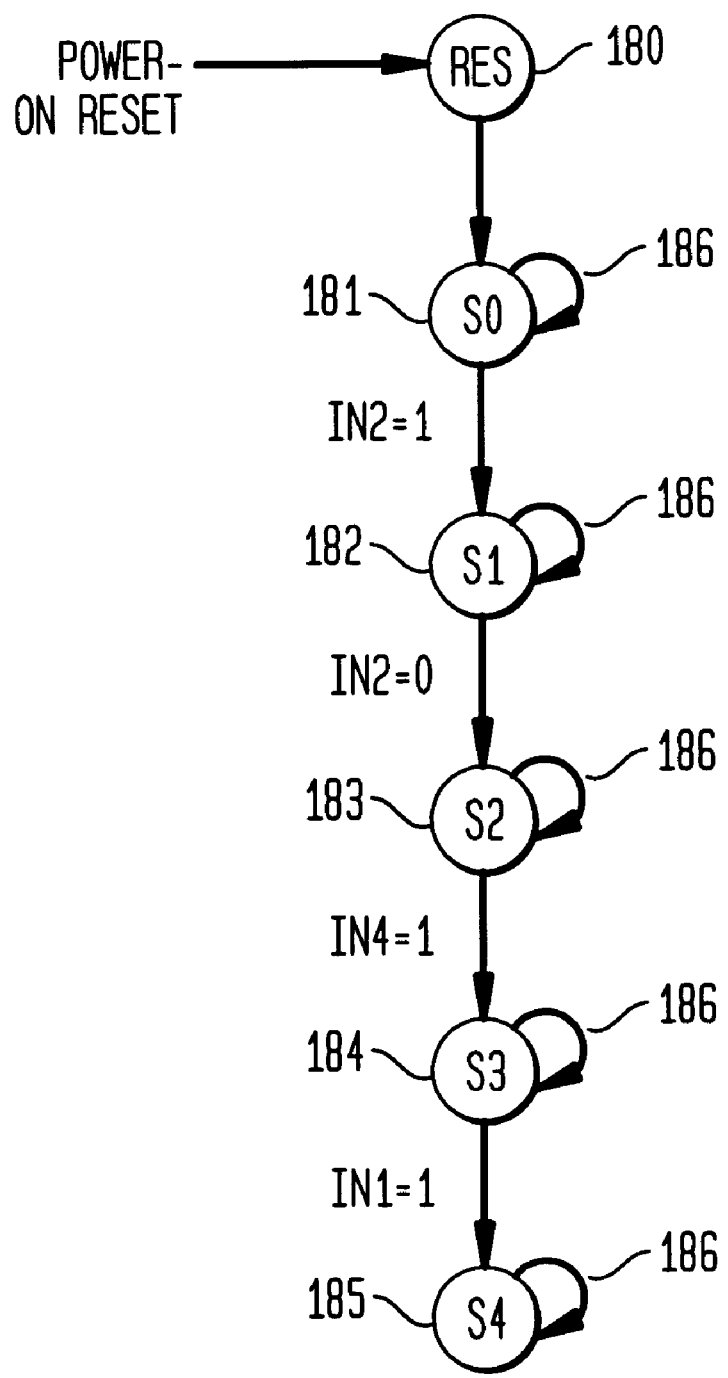
FIG. 13 shows a state diagram for explaining the operation and structure of the exemplary evaluation arrangement of FIG. 12.

Referring now to FIG. 13, there is shown an exemplary linear state diagram comprising five states for use in describing the operation and structure of the exemplary evaluation arrangement 102 shown in FIG. 12. At the beginning, usually at power-on, the state machine is being reset (RES) as shown in circle 180. This means that all flip-flops (shown in FIG. 11) are being reset with the ASRES signal. This mode is not considered a "real" state. From the RES condition in circle 180, the state machine transitions unconditionally into state S0 shown in circle 181. From this point forward the conditions denoted below each state needs to be fulfilled in order for the state machine to continue from one state to the next. If a transition condition is not fulfilled, the state machine stays in the current state, as is indicated by a "circle arrow" 186.

When the state machine is in State 0 and the transition condition of IN2=1 is fulfilled, the following occurs in the evaluation arrangement 102 of FIG. 12. The State 0 signal is high (a logical "1") on the fourteenth horizontal lead 171, and the IN2 signal is high on the fifth vertical lead 172 and low on the sixth vertical lead 172 of the matrix 170 because of the inverter 152. The connection 173 between the fifth vertical lead 172 and the thirteenth horizontal lead 171 places highs (logical "1s") on both input of the NAND gate 168 to cause the output thereof to change from a high to a low output. The NAND gate 169 is unaffected because one of its inputs in connected to ground via permanent connection 173 between the twelfth vertical lead 172 (ground) and the fifteenth horizontal lead 171 and provides a high tran0l signal. This output from NAND gate 168 indicates that a transition out of State 0 to the next State (state 1) is to be made. Once in State 1, indicated by circle 182, when the transition condition of IN2=0 occurs, a high will be applied to both the eleventh horizontal lead (State 1), and the sixth vertical lead 172 via inverter 152 in FIG. 12. The connection 173 between the sixth vertical lead 172 and the twelfth horizontal lead 171 and the Stated 1 signal causes high (logical 1) signals to be applied to both inputs of NAND gate 167. The output from the NAND gate 167 will go from a high output signal to a low output signal. The NAND gate 166 only has one high input (State 1) and a second input to NAND gate 166 is connected to ground via connection 173 on the tenth horizontal lead 171. The output from NAND gate 167 indicates a transition out of State 1 to the next State (state 2) is to be made.

Once in State 2 indicated by circle 183, when the transition condition of IN4=1 occurs, a high will be applied to both the eighth horizontal lead 171 (State 2), and the ninth vertical lead 172. The high State 2 signal and the connection 173 shown within circle 177 between the ninth vertical lead 172 and the seventh horizontal lead 171 causes high (logical 1) signals to be applied to both inputs of NAND gate 164. This causes the output tran2u signal from NAND gate 164 to change from high to low value and indicates a transition out of State 2 to the next State (state 3) is to be made. The output of NAND gate 165 associated with State 2 does not change from its high output because one of its inputs is connected to ground via permanent connection 173 between the twelfth vertical lead 172 and the ninth horizontal lead 171.

Once in State 3, indicated by circle 184, when the transition condition of IN1=1 occurs, a high will be applied to both the fifth horizontal lead 171 (State 3), and the third vertical lead 172. The high State 3 signal and the connection 173 between the third vertical lead 172 and the fourth horizontal lead 171 causes high (logical 1) signals to be applied to both inputs of NAND gate 162. This causes the output of NAND gate 162 to change from high to low and indicates a transition out of State 3 to the next State (state 4). The output of NAND gate 163 associated with State 3 does not change because one it the inputs is connected to ground via permanent connection 173 between the twelfth vertical lead 172 and the sixth horizontal lead 171.

Once in State 4 indicated by circle 185, the state machine has completed the transitions through the exemplary state diagram of FIG. 13. There is no transition out of State 4 because both NAND gates 160 and 161 have one of their inputs connected to ground via permanent connections 173 shown between the twelfth vertical lead and the first and third horizontal leads 171 of the matrix 170.

The above processing technique allows for the identification of which state has to be exited, and identifies whether the state should be exited because exactly one input variable (e.g., IN4) is true or false. This very basic evaluation information is all that is needed in order to realize a universal state diagram if the necessary transformations have been performed. If a state is to be exited unconditionally (not shown in FIG. 12 but occurs from the RES state of FIG. 13), then one of the two NAND gates associated with that state to be exited would be permanently connected to the supply voltage VEXT. If the state diagram ends in one state and there is no transition from this state to any other state, then the NAND gates (e.g., NAND gates 160 and 161) associated with this state are connected to ground (low).

Figure 14:
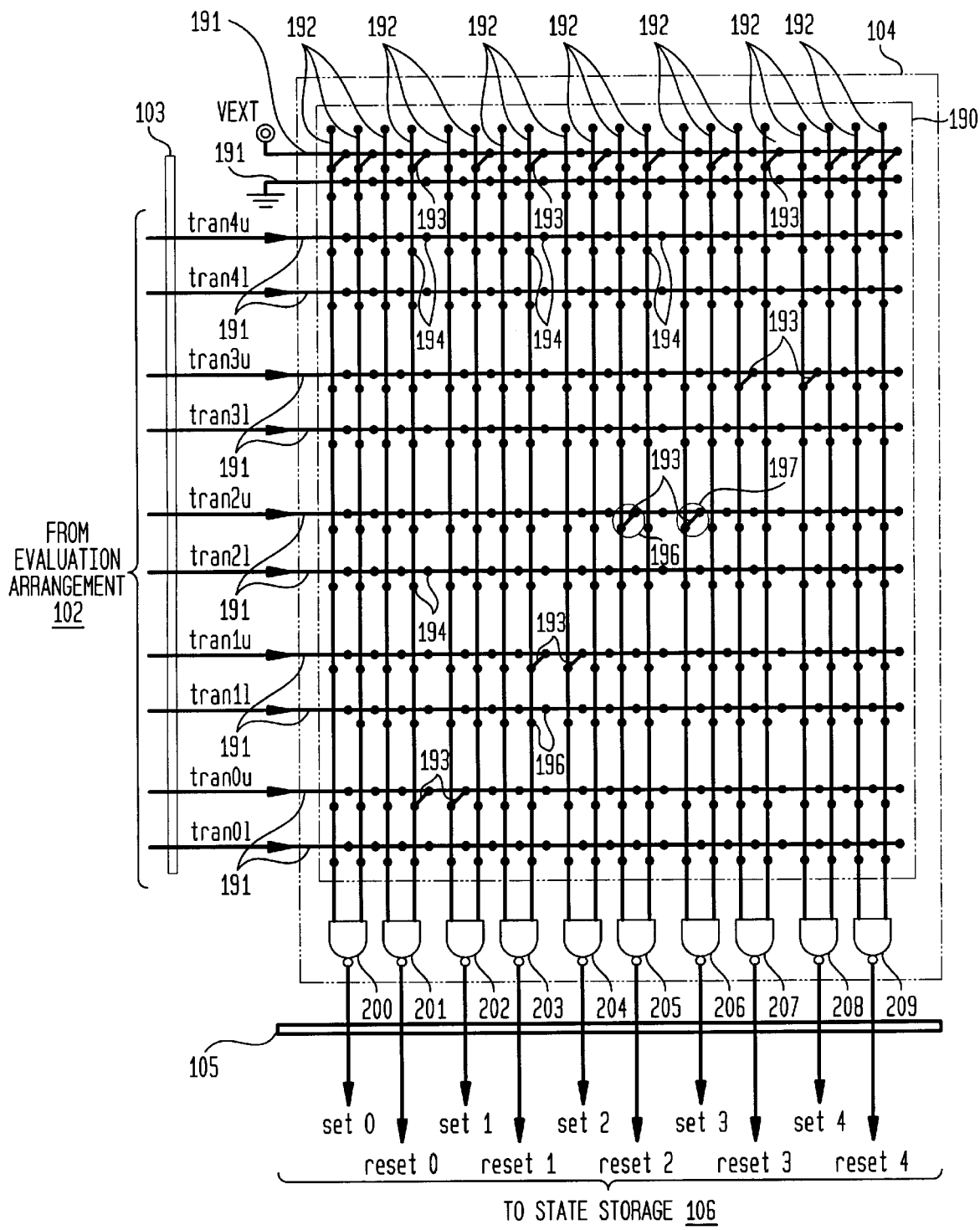
FIG. 14 shows a circuit diagram for an exemplary transition arrangement forming part of the controller of FIG. 10 in accordance with the present invention.

Referring now to FIG. 14, there is shown a circuit diagram for an exemplary transition arrangement 104 (shown within a dashed line rectangle) forming part of the controller 100 of FIG. 10 in accordance with the present invention. The exemplary transition arrangement 104 is coupled to receive each of five tran0u–tran4u signals and five tran0l–tran4l signals from the exemplary evaluation arrangement 102 shown in FIG. 12 via bus 103, and to transmit each of five set0–set4 signals and five reset0–reset4 signals to the state storage device 106 shown in FIG. 10 via bus 105. The exemplary transition arrangement 104 comprises an exemplary matrix 190 (shown within a dashed line rectangle) and ten NAND gates 200–209. It is to be understood that the transition arrangement 104 can comprise many more input signals and a larger matrix 190 when the evaluation arrangement 102 is larger than shown in FIG. 12 and transmits more input signals to the transition arrangement 104.

The matrix 190 comprises twelve parallel horizontal leads 191 that are connectable to predetermined ones of twenty parallel vertical leads 192 by separate permanent connectors 193. A potential (VEXT) from a remote power source (not shown) is coupled to the first (top) horizontal lead 191 of the matrix 190, and ground potential is applied to the second horizontal lead 191 of the matrix 190. The tran4u, tran3u, tran2u, tran1u, and tran0u input signals from the evaluation arrangement 102 are coupled to the third, fifth, seventh, ninth, and eleventh horizontal leads 191, respectively, of the matrix 190. The tran4l, tran3l, tran2l, tran1l, and tran0l input signals from the evaluation arrangement 102 are coupled to the fourth, sixth, eighth, tenth, and twelfth horizontal leads 191 of the matrix 190. First and second inputs of each of the ten NAND gates 200–209 are coupled to separate ones of the twenty vertical leads 192 of the matrix 190. For example, the NAND gate 200 has its first and second inputs coupled to the first and second vertical leads 192, respectively, the NAND gate 201 has its first and second inputs coupled to the third and fourth vertical leads 192, respectively, the NAND gate 202 has its first and second inputs coupled to the fifth and sixth vertical leads 192, respectively, etc, with the last NAND gate 209 having its first and second inputs coupled to the nineteenth and twentieth vertical leads 192, respectively. NAND gates 200, 202, 204, 206, and 208 provide the output signals set0, set1, set2, set3, and set 4, respectively, while the NAND gates 201, 203, 205, 207, and 209 provide the output signals reset0, reset1, reset2, reset3, and reset4, respectively.

The following example describes a typical operation of the transition arrangement 104. It is assumed that there is a transition from State 2 to State 3. For a transition out of State 2, the tran2u signal coupled to the seventh horizontal lead of the matrix 190 or the tran2l signal coupled to the eighth horizontal lead of the matrix 190 could go low for a transition out of State 2. As was described for the evaluation arrangement 102 of FIG. 12, the tran2u signal is the received low signal for a transition out of State 2, while all of the other input signals from the evaluation arrangement 102 remain high. The low tran2u signal is coupled to a first input of the NAND gate 205 via the connection shown within the circle 196 while a high VEXT potential is permanently coupled to the second input of the NAND gate 205 via permanent connection 193 coupling the first horizontal lead 191 to the twelfth vertical lead 192. The low and high inputs to NAND gate 205 generates a high reset2 output signal to the state storage device 106 (shown in FIGS. 10 and 11) via bus 105. Concurrently, the low tran2u signal is coupled to a first input of the NAND gate 206 via the permanent connection 193 shown within the circle 197, while VEXT is applied to a second input of NAND gate 206. This causes the NAND gate 206 to generate a high set3 output signal. The high reset2 output signal is transmitted via bus 105 to the state storage device 106 for resetting the state flip-flop 110 therein that is associated with the Set-Reset Flip-Flop 110 representing State 2. Concurrently, the high set3 output signal is transmitted via bus 105 to the state storage device 106 for setting the state flip-flop 110 therein that is associated with the Set-Reset Flip-Flop 110 representing State 3.

Where a state flip-flop 110 in the state storage device 106 is not used, then both inputs to the respective set and reset NAND gates in the transition arrangement 104 via associated the vertical leads 192 of matrix 190 would be connected to ground potential (low) on the second horizontal lead 191 via a permanent connection (not shown). This maintains the state flip-flop 110 in the state storage device 106 in a reset state after an initial power-on mode reset (ASRES). If a state diagram ends in one state and there is no further transition from this state to any other state, then the two inputs to the NAND gate that generates a reset signal of this state are coupled to the supply potential VEXT (high). Thus, the reset signal will always be low and this state will not be reset once this state has been reached. This is shown in FIG. 14 for NAND gate 209 associated with State 4.

Figure 15:
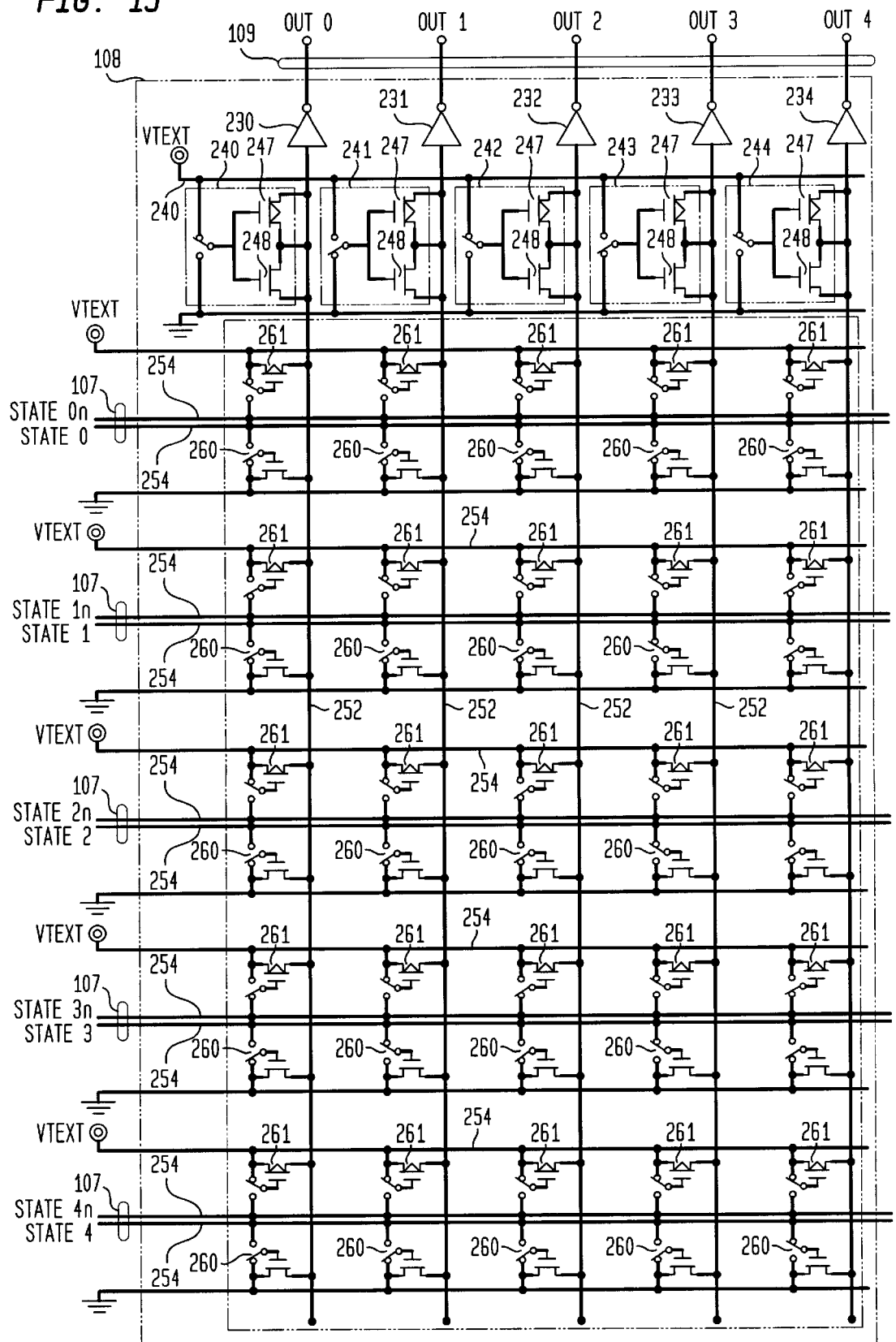
FIG. 15 shows a circuit diagram for an exemplary output arrangement forming part of the controller of FIG. 10 in accordance with the present invention.

Referring now to FIG. 15, there is shown a circuit diagram for an exemplary five-State output arrangement 108 (shown within a dashed line rectangle) forming part of the controller 100 of FIG. 10 in accordance with the present invention. The exemplary output arrangement 108 comprises first, second, third, fourth, and fifth inverters 230–234, first, second, third, fourth, and fifth Nodes 240–244 (shown within separate dashed line rectangles), and a matrix 250 (shown within a dashed line rectangle). The Nodes 240–244 are associated with the inverters 230–234, respectively. Each of the Nodes 240–244 comprises a pull-up Positive Field Effect Transistor (PFET) device 247 and a pull-down Negative Field Effect Transistor (NFET) 248 which each have a source electrode, a gate electrode, and a drain electrode. Both of the PFET 247 and NFET 248 of each of the Nodes 240–244 have their gate electrodes coupled together and selectively coupled to either an externally supplied voltage (VEXT) or ground potential. The drain electrodes of the PFET 247 and NFET 248 of each of the Nodes 240–244 are coupled together and to an input of the associated one of the inverters 230–234. The source electrodes of the PFET 247 and NFET 248 of each of the Node 240–244 are coupled to VEXT and ground potential, respectively.

By selectively coupling the gate electrodes of the PFET 247 and NFET 248 of a Node (Node 240, 241, 242, 243, or 244) to the ground potential causes the PFET 247 of the Node to be active and provide VEXT to the input of the associated one of the inverters 230–234 while the NFET is made inactive. This condition is shown for the Nodes 241 and 243 which provide VEXT to the inverters 231 and 233, respectively, without other signals being applied to the input of the inverters 231 and 233. With VEXT being applied to the input of the inverters 231 and 233, the inverters 231 and 233 are caused to maintain a low output. By selectively coupling the gate electrodes of the PFET 247 and NFET 248 of a Node (Node 240, 241, 242, 243, or 244) to the externally supplied VEXT causes the NFET 248 of the Node to be active and provide ground potential to the input of the associated one of the inverters 230–234 while the PFET 247 is made inactive. This condition is shown for the Nodes 240, 242, and 244 which provide ground potential to the inverters 230, 232, and 234, respectively, without other signals being applied to the input of these inverters 230, 232, and 234. With ground potential being applied to the input of each of the inverters 230, 232, and 234, the inverters 230, 232, and 234 are caused to maintain a high output.

The matrix 250 for the exemplary five-State Output arrangement 108 comprises first, second, third, fourth, and fifth vertical leads 252 coupled at one end to the first, second, third, fourth, and fifth inverters 230–234, respectively, twenty horizontal leads 254, twenty five Negative Field Effect Transistor (NFETs) 260, and twenty five Positive Field Effect Transistors (PFETs) 261. The twenty horizontal leads 254 of the matrix 250 are subdivided into five groups of four leads each, where each group of four leads is associated with a separate State of the state diagram of FIG. 13. A first horizontal lead 254 (e.g., the upper lead) of each group of horizontal leads 254 of each group is coupled to VEXT, a second horizontal lead 254 of each group is coupled to receive a separate associated complementary State signal (Qn) via bus 107 from the State Storage device 106, a third horizontal lead 254 of each group is coupled to receive a separate associated State signal (Q) via bus 107 from the State Storage device 106, and a fourth horizontal lead 254 of each group is coupled to ground potential. The twenty five Positive Field Effect Transistors (PFETs) 261 are subdivided into five groups of five PFETs 261 each. Each group of PFETs 261 is associated with a separate one of States 0–4. Each PFET 261 of a group of PFETs 261 has (a) its gate electrode selectively coupled to either one of the associated first horizontal leads 254 of the group that is coupled to VEXT or the associated complementary State signal (Qn), (b) its source electrode coupled to the first horizontal lead which is coupled to VEXT, and (c) its drain electrode coupled to a separate one of the five vertical leads 252. By selectively connecting the gate of a PFET 261 to VEXT, the PFET 261 is deactivated and is not responsive to an associated complementary state signal (Qn). If the gate of a PFET 261 is selectively connected to receive the associated complementary state signal (Qn), the associated input node (e.g., node 240) will be pulled to a high level when the associated complementary state signal (Qn) is active.

The twenty five Negative Field Effect Transistors (NFETs) 260 are subdivided into five groups of five NFETs 260 each. Each group of NFETs 260 is associated with a separate one of the States 0–4. Each NFET 260 of a group has (a) its gate electrode selectively coupled to either one of the associated fourth horizontal leads 254 of the group that is coupled to ground potential or the State Q signal, (b) its source electrode coupled to the fourth horizontal lead of the group that is coupled to ground potential, and (c) its drain electrode coupled to a separate one of the five vertical leads 252. By selectively connecting the gate of an NFET 260 to ground potential, the NFET 260 is deactivated and is not responsive to an associated state signal (Q). If the gate of a NFET 260 is selectively connected to receive the associated state signal (Q), the associated input node (e.g., node 240) will be pulled to a low level when the associated state signal (Q) is active. The rule is that an output signal (OUT0, OUT1, OUT2, OUT3, or OUT4) from any of the inverters 230–234 for a current State (State 0, 1, 2, 3, or 4) will be high when an associated Node (240, 241, 242, 243, or 244) is arranged as a pull-up device and the current State signal (Q) is connected to the gate of the associated NFET 260, or the Node (240, 241, 242, 243, or 244) is arranged as a pull-down device and the current State signal (Q) is not connected to the gate of either one of the associated NFET 260 and the PFET 261. Alternatively, the output signal (OUT0, OUT1, OUT2, OUT3, or OUT4) from any one of the inverters 230–234 for a current State (State 0, 1, 2, 3, 4) will be low when the associated Node (240, 241, 242, 243, or 244) is arranged as a pull-down device and the current complementary State signal (Qn) is connected to the gate of the PFET 261, or the Node (240, 241, 242, 243, or 244) is arranged as a pull-up device and the current State signal (Q) is not connected to the gate of either one of the associated NFET 260 and the associated PFET 261.

For example, if State 2 is active so that the State 2 signal in a logical "1" and the State 2n signal is a logical "0", the NFET gate 260 associated with the first vertical lead 252 to inverter 230 has its gate coupled to ground and will be deactivated. The PFET gate 261 associated with the first vertical lead 252 to inverter 230 has its gate coupled to VEXT and will also be deactivated. As a result, the node 240 having its gates coupled to VEXT will pull down the NFET 248 and deactivate the PFET 247 to supply a low input to the inverter 230. Therefore, inverter 230 will provide a high output on the OUT0 lead via bus 109. The same operation occurs for the NFET and PFET gates 260 and 261 associated with the fifth vertical lead 252 and the inverter 234 since the NFET and PFET gates 260 and 261 and the gates in the Node 247 are connected in a same manner.

Concurrently, the PFET gate 261 associated with the second vertical lead 252 to inverter 231 has its gate coupled to VEXT and is deactivated, while the NFET 260 has its gate coupled to receive the active State 2 signal. Although the node 241 is coupled as a pull-up device, the connection of the NFET 260 to the active State 2 signal causes the node 241 to be pulled down and output a low output level to the inverter 231. As a result, the inverter 231 will provide a high output on the OUT1 lead via bus 109. The same operation occurs for the NFET and PFET gates 260 and 261 associated with the fourth vertical lead 252, the inverter node 243, and the inverter 233 since the gates 260 and 261 and gates of the node 233 are connected in a same manner as described hereinabove for the second vertical lead 252.

At the same time, the PFET gate 261 associated with the third vertical lead 252 coupled to the input of inverter 232 has its gate coupled to receive the active complementary State 2 signal (State 2n) which pulls-up the Node 242 to provide a high input to the inverter 232. The NFET 260 has its gate coupled to ground and is deactivated. As a result, the inverter 231 will provide a low output on the OUT2 lead via bus 109. Therefore, when State 2 is active, the Output arrangement 108 provides high outputs on the OUT0, OUT1, OUT3, and OUT4 leads of bus 109, and a low output on the OUT2 lead of bus 109. Based on the rules provided hereinabove for the PFET gates 261 and the NFET gates 260, it can easily be determined which of the output leads OUT0–OUT4 will be logically high or low when any one of the States 0–4 are active at any instant of time. It is to be understood that the values of the output signals (OUT0–OUT4) that are produced in output arrangement 108 are dependent on the connections of the gates of PFETs 247 and NFETs 248 of the nodes 240–244 and the PFETs 261 and the NFETs 260 for each state and are, therefore, programmable.

Figure 16A:
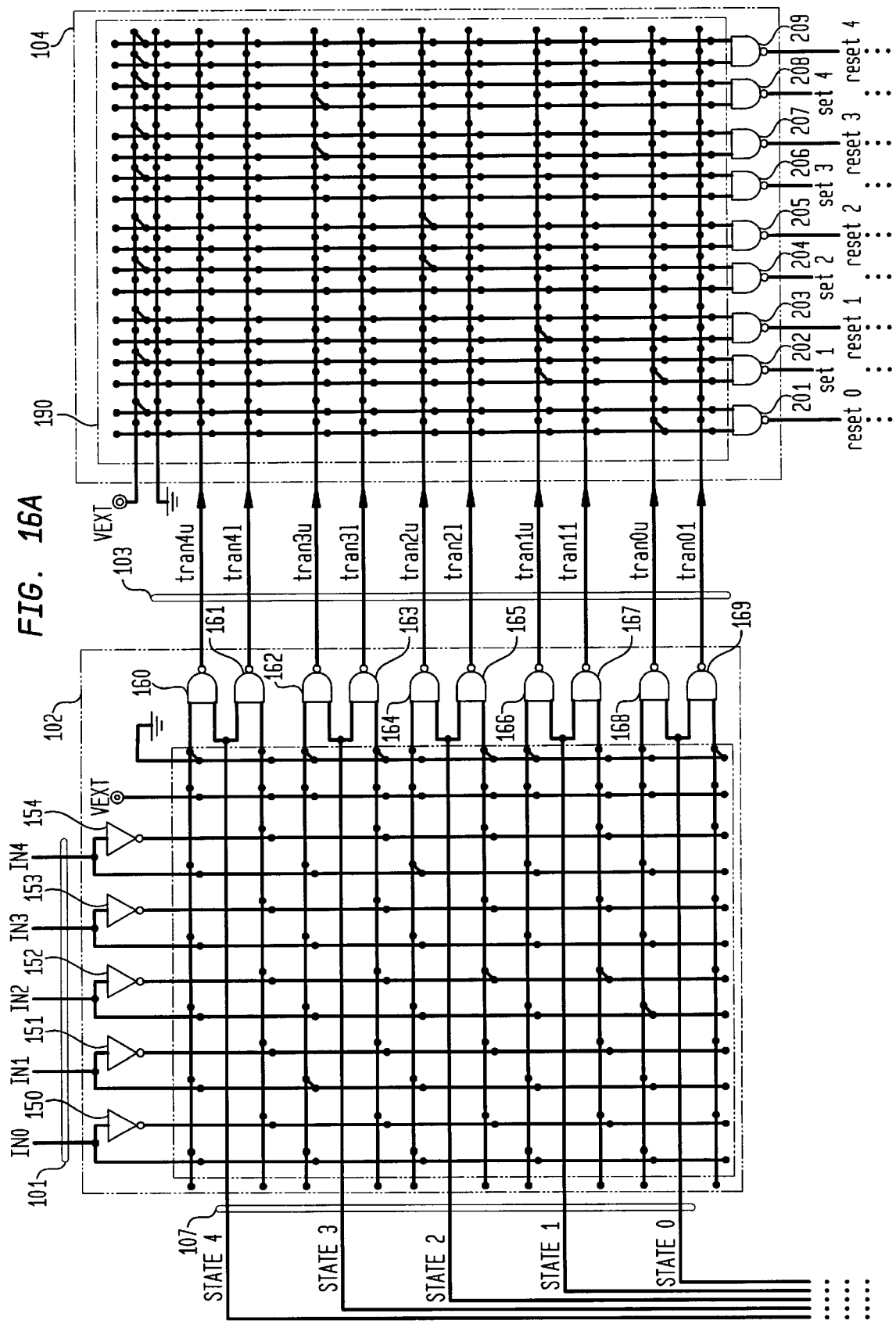
FIGS. 16A and 16B show an overall arrangement of the exemplary controller of FIG. 10 including the circuitry for the state storage device, the evaluation arrangement, and the transition arrangement, shown in FIGS. 11, 12, and 14, respectively, for operation with an exemplary linear state diagram comprising five states as is shown in FIG. 13 in accordance with the present invention.
Figure 16B:
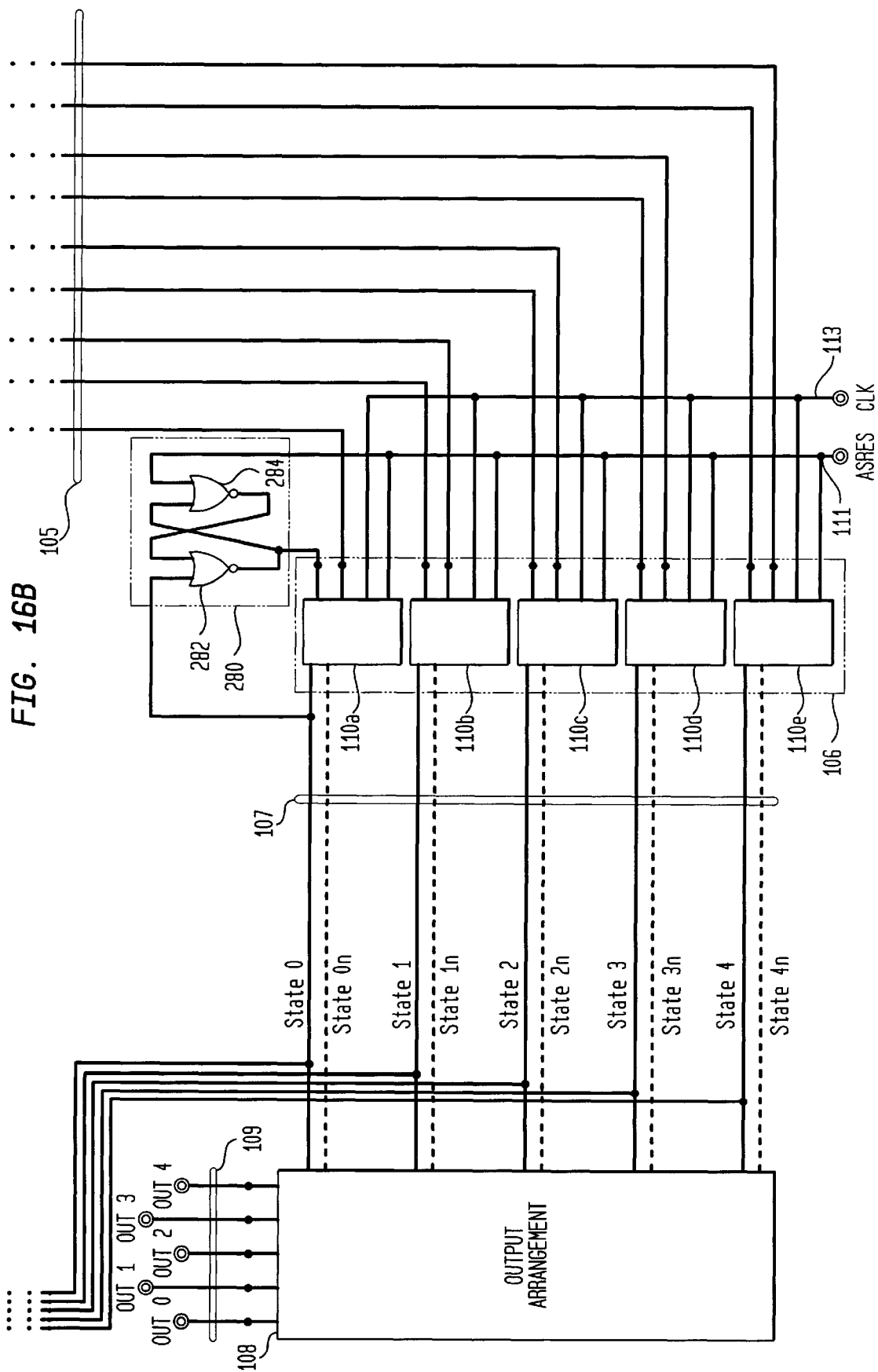

Referring now to FIGS. 16A and 16B, there is shown an overall arrangement of the exemplary controller 100 (shown within a dashed line rectangle) of FIG. 10 including circuitry for the state storage device 106, the evaluation arrangement 102, and the transition arrangement 104 as shown in FIGS. 11, 12, and 14, respectively, for operation with an exemplary linear state diagram comprising 5 states (S0–S4) as is shown in FIG. 13 for the evaluation arrangement 102 in accordance with the present invention. More particularly, the exemplary controller 100 of FIGS. 16A and 16B is capable of handling five states (States 0–4), five input signal signals (IN0–IN4), and five output signals (OUT0–OUT4). The evaluation arrangement 102 comprises five inverters 150–154, ten NAND gates 160–169, and a matrix 170. The evaluation arrangement 102 receives five input signals IN0–IN4 via bus 101 from remote devices (not shown), and five State signals (State 1–State 5) via bus 107 from a state storage device 106. The evaluation arrangement 102 generates one of tran0u–tran4u or tran0l–tran4l output signals via bus 103 at any instant of time to the transition arrangement 104. The evaluation arrangement 102 corresponds to the arrangement shown in FIG. 12, and the operation thereof corresponds to that described hereinbefore for the evaluation arrangement 102 in accordance with the linear state diagram of FIG. 13.

The transition arrangement 104 is shown as comprising nine NAND gates 201–209 and a matrix 190. The transition arrangement 104 receives any of the tran0u–tran4u and tran0l–tran4l output signals from the Evaluation arrangement 102 via bus 103, and generates predetermined ones of SET1–SET4 or RESET0–RESET4 output signals via bus 105 to the state storage device 106. The arrangement of the transition arrangement 104 corresponds to that shown in FIG. 14, except that the NAND gate 200 of FIG. 14 was not included in the transition arrangement 104 shown in FIG. 16A. The reason for this omission is that in FIG. 14, the NAND gate 200 is made inactive by the permanent coupling of both inputs to the VEXT potential. Therefore, the NAND gate 200 never provides a SET0 output signal to the state storage device 106.

The state storage device 106 comprises five Set-Reset Flip-Flops (SR F/F) 110a–110e, where each of the SR F/Fs comprises the circuitry shown in FIG. 12. An additional remote flip-flop 280 comprising NOR gates 282 and 284 are also provided for the state storage device 106. The state storage device 106 provides the output signals of States 0–4 (shown as solid lines in bus 107) and States 0n–4n (shown as dashed lines in bus 107), where the State 0n–4n signals are only received by the output arrangement 108.

At the beginning of the operation of the exemplary controller 100, the controller 100 is reset (usually at power-on). An Asynchronous Reset (ASRES) input signal (also known as a RESET signal) to the state storage device 106 goes high and then low again. This resets all flip-flops 110a–110e in the state storage device 106. This "mode" is not a "real" state according to a coding definition of the associated state machine in accordance with the present invention because in each state exactly one flip-flop (110a–110e) in the state storage device 106 has to be set, and all other flip-flops have to be reset. The additional two NOR gates 282 and 284 in additional flip-flop 280 ensures that after the initial reset the first state flip-flop 110a (for State 0) is being set. This happens unconditionally and the state machine is now in State 0. Once this has occurred, the evaluation of the input signals IN0–IN4 in the evaluation arrangement 102, the transitions through all states in transition arrangement 104, and the generation of the appropriate output signals OUT0–OUT1 can happen as described hereinbefore. It should be noted that the input signals IN0 and IN3 are not used and are not connected to any node in the evaluation arrangement 102. Still further, the state machine stays in State 4 once this state has been reached. Therefore, the tran4u and tran4l output signals from the evaluation arrangement 102 are not connected to any node in the transition arrangement 104. Additionally, the RESET4 output signal from the transition arrangement 104 is always forced to be low by connecting the two inputs of the NAND gate 209 to the supply voltage VEXT.

Figure 17:
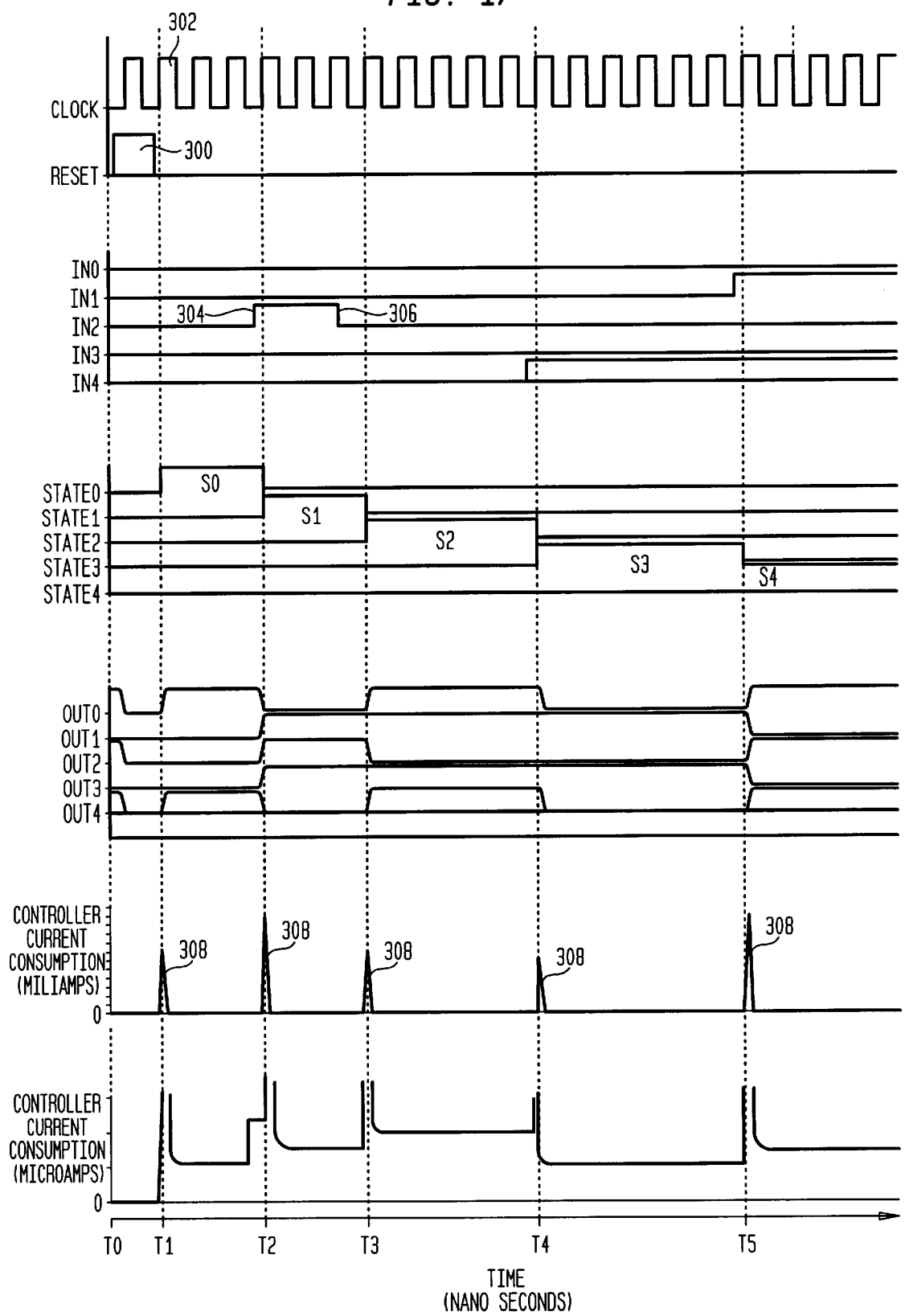
FIG. 17 shows a timing diagram of the simulation results of the exemplary controller of a copending application where only the State 0–4 are received as the controller realizes the exemplary linear state diagram of FIG. 13 in accordance with the present invention.

Referring now to FIG. 17, there is shown a timing diagram of waveforms of a clock signal, a Reset signal (an ASRES signal), IN0–IN4 signals, State 0–4 signals, OUT0–OUT4 signals, and Current consumption signals (in Milliamps and Microamps) of an exemplary Controller 100 as is shown in FIG. 15 of the copending patent application Ser. No. 09/534,104 entitled "Method and Apparatus For A Flexible Controller For A DRAM Generator Controller". In the exemplary controller 100 of the copending application, the Nodes 240–244 each comprise only a pull up PFET having its gate electrode coupled to ground, and its source and drain electrodes coupled to VEXT and a vertical lead 252 associated with a separate one of the inverters 230–234. The matrix 250 of the exemplary controller 100 of the copending application comprises twenty-five NFETs 260 with each NFET 260 having its source and drain electrodes coupled between ground potential and a respective vertical lead 252, and its gate electrode selectively coupled to either (a) ground potential to deactivate the NFET 260, or (b) a respective State input signal from the State Storage device 106 to pull down the associated one of the Nodes 240–244 when the respective State is active.

In operation, at time=0 (T0) a Reset pulse 300, corresponding to an Asynchronous Reset (ASRES) signal, resets all flip-flops 110a–110e in the state storage device 106. With a first rising clock edge 302 at time T1 after the reset pulse 300, the state machine enters state S0. Between times T1 and T2, the State 0 signal is the only state signal that is active from the state storage device 106, and results in output signals OUT0 and OUT4 from the output arrangement 108 being high. Just prior to time T2, an IN2 signal goes positive (IN2=1) which causes the state machine to transition into State 1, because the condition for transitioning from State 0 to State 1 has occurred as is shown in FIG. 13. The time between the beginning of the rise 304 in IN2 and the transition to State 2 at time T2 occurs because of the processing time of the IN2 signal in the evaluation arrangement 102 for generating the proper tran0u output signal via bus 103 as shown in FIG. 12, and the transition arrangement 104 generating the proper RESET0 and SET1 output signals to the state storage device 106 via bus 105. During the active State 1 (S1) signal from the state storage device, the output arrangement 108 generates high OUT1, OUT2, and OUT3 output signals over bus 109. As is shown in FIG. 13, once the state machine is in State 1 and the IN2 input signal goes low, the condition has been met for a transition from State 1 to State 2. In FIG. 17, the IN2 signal is shown as having a falling edge 306 just prior to time T3. As a result of IN2 going low, the evaluation arrangement 102 generates a tran1u output signal to the transition arrangement 104, and the transition arrangement 104 generates a RESET1 and a SET2 output signal to the state storage device 106 for a transition from state 1 to state 2 at time T3. During the time from T3 to T4 when the state 2 (S2) is high, the output arrangement 108 generates high OUT0, OUT 1, OUT3, and OUT4 signals via bus 109. A similar operation occurs for transitioning from State 2 to State 3 at time T4 just after IN4 goes high, and from State 3 to State 4 at time T5 after IN1 goes high where different output signals (OUT0–OUT4) are accordingly generated. Once the state machine is in state 4 (S4) it remains there (as shown in FIG. 13) until another RESET signal (not shown) is generated at which time the sequence starts again.

With reference to the Controller Current Consumption curves shown for milliamp and microamp values, with every state transition (e.g., S0 to S1) there occurs a large spike 308 of current. These current spikes 308 are a normal phenomenon in CMOS circuitry such as the PFETs and NFETs in the output arrangement 108. More particularly, whenever a CMOS circuit is switching, it draws a spike-like current from a remote power supply network (note shown). Therefore, the height of the spike 308 depends on the circuits involved with each transition. The bottom waveform shows the controller current consumption with a scale zoomed into the micro-ampere range. This waveform more clearly shows the DC component of the current consumption due to the output arrangement 108 of the copending application. With every state (S0, S1, S2, S3, and S4), the current consumption in the output arrangement 108 changes depending on the output vector (OUT0–4 signals) that is associated with the respective state. For example, for the five-state state diagram shown in FIG. 13, the current in the final state S4 of the state diagram is approximately 35 microamps. For a case of a more realistic fifteen to twenty output signals from the output arrangement 108 of the copending application, this current could have a value of more than 150 microamps. While this current consumption can be neglected during a normal operation of a chip, it is not negligible when the chip is in a "sleep" mode. In the "sleep" mode, the overall generator system controlled by the controller 100 (including all other components) should not consume more than 80 microamps. Therefore, the Output arrangement of the copending application causes a fairly large (bias) current consumption of the controller circuit 100.

Figure 18:
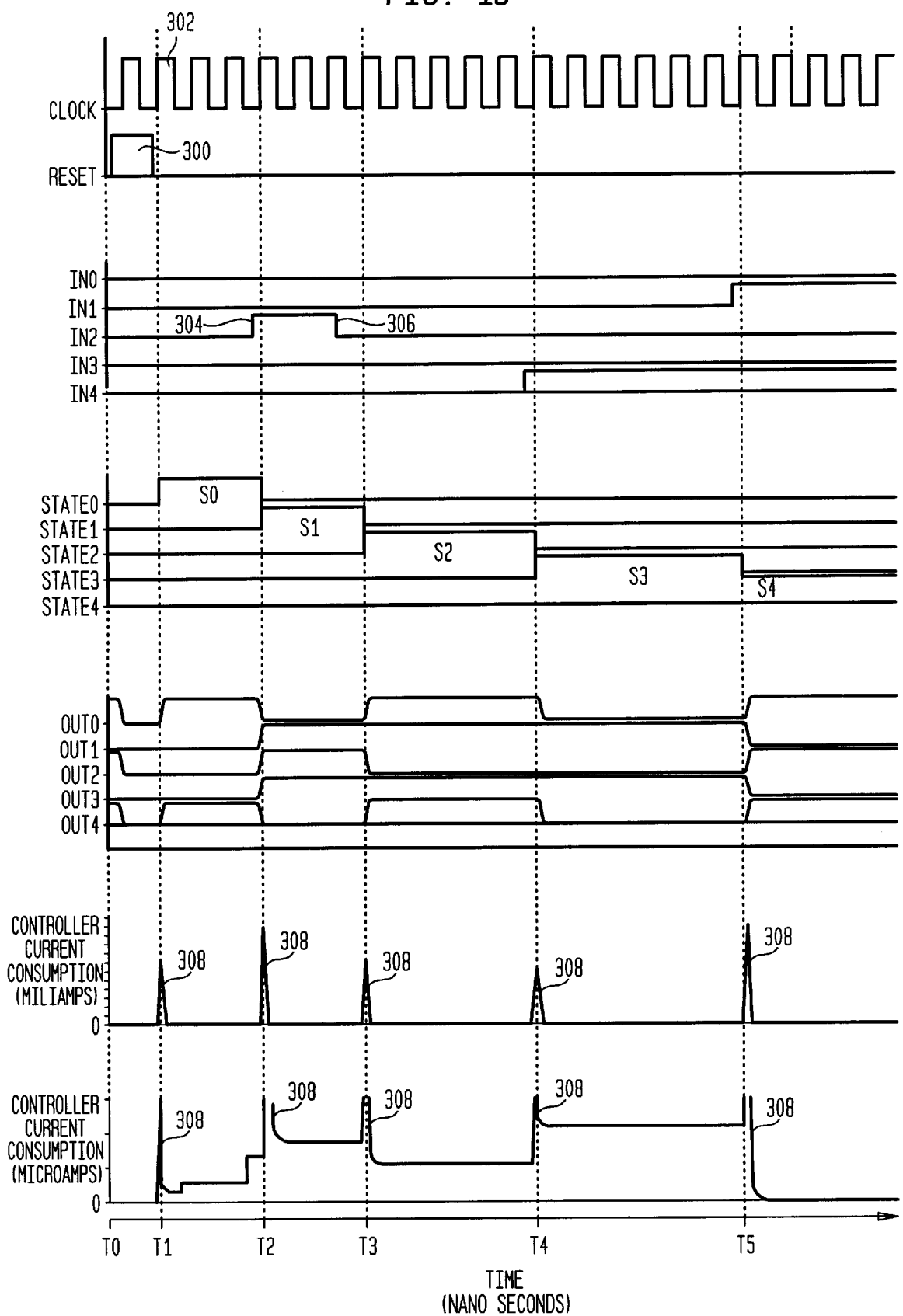
FIG. 18 shows a timing diagram of the simulation results of the present exemplary controller of FIGS. 16A and 16B where only the State 0–4 are received as the controller realizes the exemplary linear state diagram of FIG. 13 in accordance with the present invention.

Referring now to FIG. 18, there is shown a timing diagram of waveforms of a clock signal, a Reset signal (an ASRES signal), IN0–IN4 signals, State 0–4 signals, OUT0–OUT4 signals, and the Current consumption curves of the Controller 100 shown in FIGS. 16A and 16B including the improved Output arrangement 108 of FIG. 15 in accordance with the present invention. The clock signal, Reset signal, IN0–IN4 signals, State 0–4 signals, and OUT0–OUT4 signals of the timing diagram of FIG. 18 correspond to that shown in the timing diagram of FIG. 17 for the Controller of the copending application since both controllers 100 operate as outlined above in relation to the state diagram of FIG. 13. For example, when State 0 is active, the OUT0 signal from inverter 230 of FIG. 15 has a high value. This results from both of the PFET 261 and NFET 260 in the matrix 250 being deactivated because their gates are not connected to the State 0n and State 0 signals, respectively. Concurrently, the node 240 associated with inverter 230 has the gates of its PFET 247 and NFET 248 connected to VEXT to disable the PFET and activate the pull-down NFET to provide a low level input to the inverter 230 which, in turn, provides a high value for output IN0. FIG. 18 shows an analogous simulation of current consumption to that of FIG. 17. The improvement is that the DC current consumption of the controller 100, due to the configuration of the present Output arrangement 108, in the final state S4 is reduced to substantially zero. Therefore, in a "sleep" mode, the overall generator system controlled by the controller 100 (including all other components) consumes much less than the maximum allowable 80 microamps.

Figure 19:
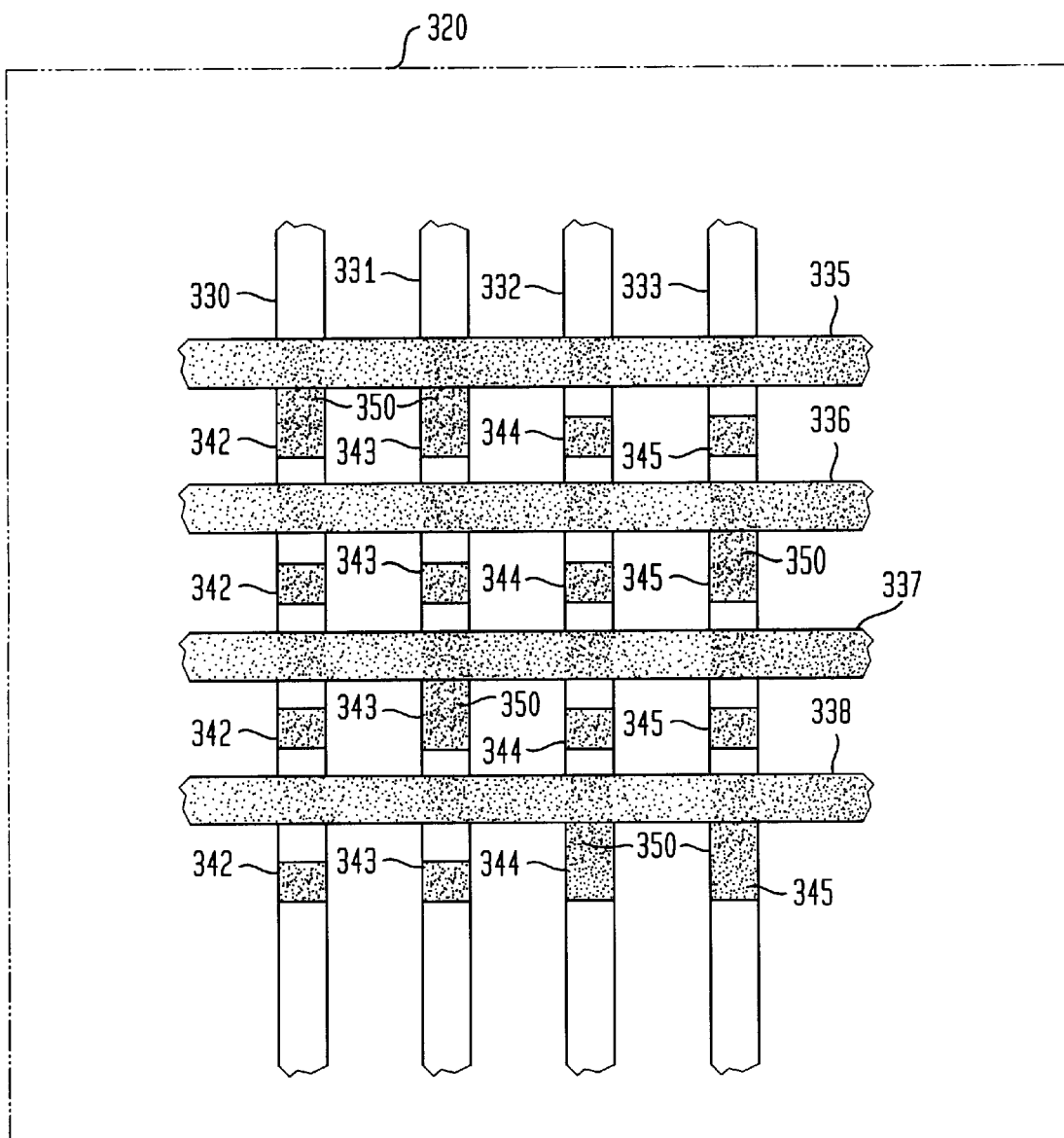
FIG. 19 shows an exemplary arrangement of a partial matrix which can be used in the evaluation arrangement and/or the transition arrangement of FIGS. 12 and 14, respectively, in accordance with the present invention.

Referring now to FIG. 19, there is shown an exemplary arrangement of a partial matrix 320 (shown within a dashed line rectangle) which can be used in the evaluation arrangement 102 and/or the transition arrangement 104 of FIGS. 12 and 14, respectively, in accordance with the present invention. The partial matrix 320 comprises first, second, third, and fourth vertical electrically conductive metal lines 330, 331, 332, and 333, respectively, first, second, third, and fourth horizontal electrically conductive metal lines 335, 336, 337, and 338, respectively, a separate set of first, second, third, and fourth electrically conductive contacts 342, 343, 344, and 345, respectively, which are formed on the respective first, second, third, and fourth vertical electrically conductive metal lines 330, 331, 332, and 333 below each of the first, second, third, and fourth horizontal electrically conductive metal lines 335, 336, 337, and 338. A desired connection can easily be made between a particular one of the vertical electrically conductive metal lines 330, 331, 332, and 333 and a particular one of the horizontal electrically conductive metal lines 335, 336, 337, and 338 by adding a piece of electrically conductive material 350 that couples the vertical metal line to the desired horizontal metal line as shown, for example, between metal contact 342 on the first vertical metal line 330 and the first horizontal metal line 335. A simple addition or removal of a piece of electrically conductive material 350 to make or break a connection between a vertical and horizontal metal line allows for programming changes in a late stage of a design project. It also allows a designer to alter the behavior of the controller 100 by a "metal-fix", which means a cost effective design change can be made that involves only one metal layer.

As one embodiment of the present invention, the horizontal lines 335–339 can comprise a first type of metal conductor, and the vertical lines 330–333 can comprise a second type of metal conductor where the metal connector 350 comprises either one of the first or second type of metal conductor. It is another embodiment of the present invention that any other contact arrangement can be used for making contact between a particular vertical metal line (330–333) and a particular horizontal metal line (335–339) to provide a a cost effective design change to be made involving the addition or removal of only one metal layer. Such contact arrangement can be used in place of the contacts 342–345 and the connectors 345 shown in FIG. 18. The contact arrangement can be used in any one or all of the evaluation arrangement 102, the transition arrangement 104, and the output arrangement 108 (where the NFETs 260 of FIG. 15 are replaceable by a suitable contact arrangement).

Since the controller 100 of FIGS. 10 and 16 has a highly regular structure, it is easily possible to lay out parallel signal lines (e.g., lines for all state signals S0–S4, all transition signals tran0u–tran4u and tran0I to tran4I, etc.) in an identical way. This will provide the parallel signal lines in buses 103, 105, and 107 substantially identical parasitic resistance values and capacitive loads. Thus a signal delay on these lines will be identical. This allows for an easy determination of the critical path within the controller 100, and a determination of a safe maximum operating frequency.

The advantages of the present controller 100 are as follows. First, the output arrangement 108 can be realized in a very regular and simple structure. Since there is always exactly one state signal that is high, no combinational logic is needed in order to decode the output state signals from the flip-flops 110a–110n in the state storage device 106. If a combinational logic would be needed, the signals from the flip-flops 110a–110n could have different delay times through the output arrangement 108. This could cause errors in the output signals, and to avoid such errors it would be necessary to synchronize the output signals to the clock signal.

Second, for an evaluation of the input signals (IN0–IN4) in the evaluation arrangement 102, it is not necessary to decode the state signals (S0–S4) from the state storage device 106 since a 1-out-of-N state coding allows an easy logical combining of the state information (state 0–state 4) with the input information (IN0–IN4).

Third, it must be ensured that a state machine starts properly at the power-on mode of operation. This includes resetting of all flip-flops 110a–110n in the state storage device 106 to their "start value", and that there is no timing violation (with respect to the clock) when the RESET (or ASRES) signal ends. If such actions are not met, it could happen that in the first transition from the "Reset state" to the first state, all of the flip-flops 110a–110n that are supposed to switch may not do so. This can cause the state machine to go into either a wrong state or into an undefined state. The present controller 100 arrangement avoids this possibility since the transition from the "Reset state" (all flip-flops 110a–110n are reset) into the first state (S0) resets exactly one flip-flop and is done in a safe manner. If there is a set-time/hold-time violation in the controller 100 when the RESET pulse ends, then this exactly one flip-flop will either switch with the current clock edge or it will switch with the next clock edge (delay of one clock cycle). In either case, no wrong or undefined state will be entered.

Fourth, an important aspect of the present invention is that in the structure of the state machine, there is a clear separation between the evaluation arrangement 102 and the transition arrangement 104. Every transition between two states is characterized by exactly one transition signal (tran0u–tran4u and tran0I–tran4I) going low. This transition signal causes the setting of the next-state flip-flop (one of 110a–110n) and a resetting of the current-state flip-flop. With only one transition signal causing the setting and resetting operation in the flip-flops 110a–110n, any possible timing violation is substantially without consequence. Either the setting/resetting occurs with a current clock edge, or both the setting/resetting will be delayed by one clock cycle. No wrong or undefined state will occur. This safety is additionally increased (statistically) by the fact that only two flip-flops (1-out-of-N coding) are involved in any state transition. Thus there is a savings of additional circuitry for input signal synchronization and the use in the controller 100 of unsynchronized signals.

Fifth, a characteristic of the controller 100 is that the output signals (IN0–IN4) are only dependent on the State signals, an not on the input signals (IN0–IN4). If the controller were dependent on the input signals, the generation of the output signals would not be as simple as afforded by the controller 100. Combinatorial logic circuitry would be necessary to combine state signals (S0–S4) and input signals (IN0–IN4). Then, if unsynchronized input signals are used, this could lead to unacceptable errors in the output signals, and a requirement for synchronization circuitry for the output signals (IN0–IN4).

Sixth, a most important aspect of the present controller 100 is that it can be "programmed" (or "configured") in a very late state of a design project as is shown, for example, in FIG. 18.

Seventh, an improved Output arrangement 108 is provided so that when the controller 100 is in a "sleep" mode, the current (bias) consumption is substantially zero in accordance with the present invention.

It is to be appreciated and understood that the specific embodiments of the invention described hereinabove are merely illustrative of the general principles of the invention. Various modifications may be made by those skilled in the art which are consistent with the principles set forth. For example, any one or all of the evaluation arrangement 102, the transition arrangement 104, the state storage device 106, and the output arrangement 108 can be comprise any other suitable arrangement that operates in the manner described hereinbefore for each of those elements while permitting an easy programming change in a late stage of a design and a same operational security.

What is claimed is:

1. A controller for controlling a generator system on a memory chip, the controller operating as a state machine in accordance with a state diagram including a plurality of X states and comprising:
    a state storage device which is responsive to input signals indicating a change in the state diagram from a current state to a next state of the plurality of X states for generating a revised plurality of X state output signals comprising a true State signal and a complementary true State signal for the next state of the plurality of X states; and
    an output arrangement responsive to the true State signal and the complementary true State signal in the revised plurality of X state output signals from the state storage device for generating separate predetermined ones of M output signals associated with said next state for controlling the generator system while providing substantially zero bias current consumption when the state diagram reaches a final state of the plurality of X states.

2. The controller of claim 1 wherein the output arrangement comprises:
    an output matrix comprising:
        a plurality of parallel first conductive lines which are subdivided into X groups of four first conductive lines each, each group of first conductive lines is associated with a separate one of the plurality of X states, and comprises a first conductive line coupled to a logical "1" potential, a second conductive line coupled to receive a separate complementary true State signal in the revised plurality of X state output signals, a third conductive line coupled to receive the separate true State signal in the revised plurality of X state output signals associated with the true State signal coupled to the second conductive line, and a fourth conductive line coupled to ground potential; and
        a plurality of M parallel second conductive lines which are substantially orthogonal to the plurality of parallel first conductive lines and overlap the group of parallel first conductive lines at predetermined crosspoints.

3. The controller of claim 2 where the output arrangement further comprises:
    a plurality of M inverters, each inverter being coupled to a first end of a separate one of the plurality of M second conductive lines for providing a separate one of a plurality of M output signals for controlling the generator system: and
    a plurality of M first connection devices, each first connection device being associated with a separate one of the plurality of M parallel second conductive lines for selectively coupling an input of an associated one of the plurality of M inverters to one of a group consisting of a logical "1" signal and ground potential for pulling-up and pulling-down, respectively, the input of the associated inverter when no other signals are applied to the associated separate one of the M second conductive lines.

4. The controller of claim 3, wherein each first connection device comprises:
    a Positive Field Effect Transistor (PFET) comprising a source electrode coupled to the logical "1" potential, a drain electrode coupled to the associated one of the plurality of M parallel second conductive lines, and a gate electrode selectively coupled to one of a group consisting of (a) the logical "1" potential for disabling the PFET, and (b) ground potential for enabling the PFET for pulling-up the input of the associated inverter; and
    a Negative Field Effect Transistor (NFET) comprising a source electrode coupled to ground potential, a drain electrode coupled to the drain electrode of the PFET and to the associated one of the plurality of M parallel second conductive lines, and a gate electrode selectively coupled to the gate electrode of the PFET and to a same one of a group consisting of (a) the logical "1" potential for pulling-down the input of the associated inverter, and (b) ground potential for disabling the NFET.

5. The controller of claim 4, wherein the output matrix further comprises:
    a plurality of second connection devices which are subdivided into X groups of M second connection devices each, each second connection device being associated with a separate crosspoint area between each group of four first conductive lines of the plurality of parallel first conductive lines and a separate one of the M second conductive lines, each second connection device of a group of M second connection devices comprising:
        an PFET comprising a source electrode coupled to the first conductive line of the associated group of four first conductive lines which is coupled to the logical "1" potential, a drain electrode coupled to a separate one of the associated one of the plurality of M parallel second conductive lines, and a gate electrode selectively coupled to one of a group consisting of (a) the first conductive line coupled to the logical "1" potential for disabling the PFET, and (b) the second conductive line receiving the associated complementary true State signal for pulling up the first connection device coupled to the associated separate one of the associated plurality of M parallel second conductive lines; and
        an NFET comprising a source electrode coupled to the fourth conductive line of the associated group of four first conductive lines which is coupled to the ground potential, a drain electrode coupled to a separate one of the associated plurality of M parallel second conductive lines, and a gate electrode selectively coupled to one of a group consisting of (a) the fourth conductive line coupled to the ground potential for disabling the NFET, and (b) the third conductive line receiving the associated true state signal for pulling down the first connection device coupled to the associated separate one of the associated plurality of M parallel second conductive lines when the associated State of the state diagram is active, and no more than one of the associated PFET and NFET will be selectively made active in each second connection device.

6. The controller of claim 2, wherein the output matrix further comprises:
    a plurality of first connection devices which are subdivided in X groups of M second connection devices each, each first connection device being associated with a separate crosspoint area between each group of four first conductive line of the plurality of X parallel first conductive lines and a separate one of the M second conductive lines, each first connection device of a group of M first connection devices comprising:

an PFET comprising a source electrode coupled to the first conductive line of the associated group of four first conductive lines which is coupled to the logical "1" potential, a drain electrode coupled to a separate one of the associated one of the plurality of M parallel second conductive lines, and a gate electrode selectively coupled to one of a group consisting of (a) the first conductive line coupled to the logical "1" potential for disabling the PFET, and (b) the second conductive line receiving the associated complementary true State signal for providing a pull-up signal on the associated separate one of the associated plurality of M parallel second conductive lines; and an NFET comprising a source electrode coupled to the fourth conductive line of the associated group of four first conductive lines which is coupled to the ground potential, a drain electrode coupled to a separate one of the associated plurality of M parallel second conductive lines, and a gate electrode selectively coupled to one of a group consisting of (a) the fourth conductive line coupled to the ground potential for disabling the NFET, and (b) the third conductive line receiving the associated true state signal for providing a pull-down signal to the associated separate one of the associated plurality of M parallel second conductive lines when the associated State of the state diagram is active, and no more than one of the associated PFET and NFET will be selectively made active in each first connection device.

7. The controller of claim 6 where the output arrangement further comprises:

a plurality of M inverters, each inverter being coupled to a first end of a separate one of the plurality of M second conductive line for providing a separate one of a plurality of M output signals for controlling the generator system: and a plurality of M second connection devices, each second connection device being associated with a separate one of the plurality of M parallel second conductive lines for selectively coupling an input of an associated one of the plurality of M inverters to one of a group consisting of a logical "1" signal and ground potential for pulling-up and pulling-down, respectively, the input of the associated inverter when respective no pull-down or pull-up signals are applied to the associated separate one of the M second conductive lines from associated ones of the first connection devices.

8. The controller of claim 7, wherein each second connection device comprises:

a Positive Field Effect Transistor (PFET) comprising a source electrode coupled to the logical "1" potential, a drain electrode coupled to the associated one of the plurality of M parallel second conductive lines, and a gate electrode selectively coupled to one of a group consisting of (a) the logical "1" potential for disabling the PFET and (b) ground potential for enabling the PFET for pulling-up the input of the associated inverter when no pull-down signal is supplied from associated ones of the first connection devices; and a Negative Field Effect Transistor (NFET) comprising a source electrode coupled to ground potential, a drain electrode coupled to the drain electrode of the PFET and the associated one of the plurality of M parallel second conductive lines, and a gate electrode selectively coupled to the gate electrode of the PFET and to the same one of a group consisting of (a) the logical "1" potential for pulling-down the input of the associated inverter when no pull-up signal is supplied from associated ones of the first connection devices, and (b) ground potential for disabling the NFET.

9. A controller for controlling a remote system on a memory chip which operates in accordance with a state diagram including a plurality of X states, the controller comprising:

an evaluation arrangement that is responsive at any instant of time for evaluating only one of a plurality of N input signals to the controller from remote devices in relation to only one of a plurality of X state signals, and generating one of a plurality of Y output signals that has a predetermined logical value for entering a next state in the state diagram when a condition has been met wherein the one state signal and the one input signal have met predetermined logical conditions;

a state storage device which is responsive to the one of a plurality of Y output signals that has a predetermined logical value from the evaluation arrangement for generating a revised plurality of X state output signals comprising a true State signal and a complementary true State signal for the next state of the plurality of X states, where the true State signal is transmitted back to the evaluation arrangement indicating a change in the state diagram from a current state to a next state of the plurality of X states; and an output arrangement responsive to the true State signal and the complementary true State signal of the revised plurality of X state output signals from the state storage device for generating separate predetermined ones of M output signals associated with said next state for controlling the generator system while providing substantially zero current consumption when the state diagram reaches a final state of the plurality of X states.

10. The controller of claim 9 wherein the output arrangement comprises:

an output matrix comprising:

a plurality of parallel first conductive lines which are subdivided in X groups of four first conductive lines each where each group of first conductive lines are associated with a separate one of the plurality of X states, each group of first conductive lines having a first conductive line coupled to a logical "1" potential, a second conductive line coupled to receive a separate complementary true State signal in the revised plurality of X state output signals, a third conductive line coupled to receive the separate true State signal in the revised plurality of X state output signals associated with the true State signal coupled to the second conductive line, and a fourth conductive line coupled to ground potential; and a plurality of M parallel second conductive lines which are substantially orthogonal to the plurality of parallel first conductive lines and overlap the group of parallel first conductive lines at predetermined crosspoint areas.

11. The controller of claim 10 where the output arrangement further comprises:

a plurality of M inverters, each inverter being coupled to a first end of a separate one of the plurality of M second conductive lines for providing a separate one of a plurality of M output signals for controlling the generator system; and a plurality of M first connection devices, each first connection device being associated with a separate one of the plurality of M parallel second conductive lines for selectively coupling an input of an associated one of the plurality of M inverters to one of a group consisting of a logical "1" signal and ground potential for pulling-up and pulling-down, respectively, the input of the associated inverter when no other signals are applied to the associated separate one of the M second conductive lines.

12. The controller of claim 11, wherein each first connection device comprises:

a Positive Field Effect Transistor (PFET) comprising a source electrode coupled to the logical "1" potential, a drain electrode coupled to the associated one of the plurality of M parallel second conductive lines, and a gate electrode selectively coupled to one of a group consisting of (a) the logical "1" potential for disabling the PFET, and (b) ground potential for enabling the PFET for pulling-up the input of the associated inverter; and a Negative Field Effect Transistor (NFET) comprising a source electrode coupled to ground potential, a drain electrode coupled to the drain electrode of the PFET and to the associated one of the plurality of M parallel second conductive lines, and a gate electrode selectively coupled to the gate electrode of the PFET and to a same one of a group consisting of (a) the logical "1" potential for pulling-down the input of the associated inverter, and (b) ground potential for disabling the NFET.

13. The controller of claim 12, wherein the output matrix further comprises:

a plurality of second connection devices which are subdivided into X groups of M second connection devices each, each second connection device being associated with a separate crosspoint area between each group of four first conductive lines of the plurality of parallel first conductive lines and a separate one of the M second conductive lines, each second connection device of a group of M second connection devices comprising:

an PFET comprising a source electrode coupled to the first conductive line of the associated group of four first conductive lines which is coupled to the logical "1" potential, a drain electrode coupled to a separate one of the associated one of the plurality of M parallel second conductive lines, and a gate electrode selectively coupled to one of a group consisting of (a) the first conductive line coupled to the logical "1" potential for disabling the PFET, and (b) the second conductive line receiving the associated complementary true State signal for pulling up the first connection device coupled to the associated separate one of the associated plurality of M parallel second conductive lines; and an NFET comprising a source electrode coupled to the fourth conductive line of the associated group of four first conductive lines which is coupled to the ground potential, a drain electrode coupled to a separate one of the associated plurality of M parallel second conductive lines, and a gate electrode selectively coupled to one of a group consisting of (a) the fourth conductive line coupled to the ground potential for disabling the NFET, and (b) the third conductive line receiving the associated true state signal for pulling down the first connection device coupled to the associated separate one of the associated plurality of M parallel second conductive lines when the associated State of the state diagram is active, and no more than one of the associated PFET and NFET will be selectively made active in each second connection device.

14. The controller of claim 10, wherein the output matrix further comprises:

a plurality of first connection devices which are subdivided in X groups of M second connection devices each, each first connection device being associated with a separate crosspoint area between each group of four first conductive line of the plurality of X parallel first conductive lines and a separate one of the M second conductive lines, each first connection device of a group of M first connection devices comprising:

an PFET comprising a source electrode coupled to the first conductive line of the associated group of four first conductive lines which is coupled to the logical "1" potential, a drain electrode coupled to a separate one of the associated one of the plurality of M parallel second conductive lines, and a gate electrode selectively coupled to one of a group consisting of (a) the first conductive line coupled to the logical "1" potential for disabling the PFET, and (b) the second conductive line receiving the associated complementary true State signal for providing a pull-up signal on the associated separate one of the associated plurality of M parallel second conductive lines; and an NFET comprising a source electrode coupled to the fourth conductive line of the associated group of four first conductive lines which is coupled to the ground potential, a drain electrode coupled to a separate one of the associated plurality of M parallel second conductive lines, and a gate electrode selectively coupled to one of a group consisting of (a) the fourth conductive line coupled to the ground potential for disabling the NFET, and (b) the third conductive line receiving the associated true state signal for providing a pull-down signal to the associated separate one of the associated plurality of M parallel second conductive lines when the associated State of the state diagram is active, and no more than one of the associated PFET and NFET will be selectively made active in each first connection device.

15. The controller of claim 14 where the output arrangement further comprises:

a plurality of M inverters, each inverter being coupled to a first end of a separate one of the plurality of M second conductive lines for providing a separate one of a plurality of M output signals for controlling the generator system; and a plurality of M first connection devices, each first connection device being associated with a separate one of the plurality of M parallel second conductive lines for selectively coupling an input of an associated one of the plurality of M inverters to one of a group consisting of a logical "1" signal and ground potential for pulling-up and pulling-down, respectively, the input of the associated inverter when no other signals are applied to the associated separate one of the M second conductive lines.

16. The controller of claim 15, wherein each second connection device comprises:

a Positive Field Effect Transistor (PFET) comprising a source electrode coupled to the logical "1" potential, a drain electrode coupled to the associated one of the plurality of M parallel second conductive lines, and a gate electrode selectively coupled to one of a group consisting of (a) the logical "1" potential for disabling the PVT and (b) ground potential for enabling the PVT for pulling-up the input of the associated inverter when no pull-down signal is supplied from associated ones of the first connection devices; and a Negative Field Effect Transistor (NFET) comprising a source electrode coupled to ground potential, a drain electrode coupled to the drain electrode of the PVT and the associated one of the plurality of M parallel second conductive lines, and a gate electrode selectively coupled to the gate electrode of the PVT and to the same one of a group consisting of (a) the logical "1" potential for pulling-down the input of the associated inverter when no pull-up signal is supplied from associated ones of the first connection devices, and (b) ground potential for disabling the NFET.

17. A method for controlling a generator system on a memory chip with a controller operating as a state machine in accordance with a state diagram including a plurality of X states, comprising the steps of:

(a) generating a revised plurality of X state output signals comprising a true State signal and a complementary true State signal for a next state of the plurality of X states in a state storage device in responsive to input signals indicating a change in the state diagram from a current state to the next state of the plurality of X states; and (b) generating separate predetermined ones of M output signals associated with said next state for controlling the generator system in an output arrangement that is responsive to both the true State signal and the complementary true State signal in the revised plurality of X state output signals from the state storage device generated in step (a) while providing substantially zero current consumption when the state diagram reaches a final state of the plurality of X states in the state diagram.

18. The method of claim 17 wherein in performing step (b) performing the substeps of:

(c) subdividing a plurality of parallel first conductive lines in an output matrix of the output arrangement into X groups of four first conductive lines each where each group of first conductive lines is associated with a separate one of the plurality of X states, and (c1) coupling a first conductive line of each of the X groups of four first conductive lines to a logical "1" potential, (c2) coupling a second conductive line of each of the X groups of four first conductive lines to receive a separate complementary true State signal in the revised plurality of X state output signals, (c3) coupling a third conductive line of each of the X groups of four first conductive lines to receive the separate true State signal in the revised plurality of X state output signals associated with the true State signal coupled to the second conductive line, and (c4) coupling a fourth conductive line of each of the X groups of four first conductive lines to ground potential; and (d) arranging a plurality of M parallel second conductive lines which are substantially orthogonal to the plurality of parallel first conductive lines and overlap the group of parallel first conductive lines at predetermined crosspoints.

19. The method of claim 18 wherein in performing step (b) comprising the further substeps of:

(e) coupling each of a plurality of M inverters to a first end of a separate one of the plurality of M second conductive lines for providing a separate one of a plurality of M output signals for controlling the generator system; and (f) associating a first connection device of a plurality of M first connection devices with a separate one of the plurality of M parallel second conductive lines for selectively coupling an input of an associated one of the plurality of M inverters to one of a group consisting of a logical "1" signal and ground potential for pulling-up and pulling-down, respectively, the input of the associated inverter when no other signals are applied to the associated separate one of the M second conductive lines.

20. The method of claim 19 wherein in performing step (b) comprising the further substeps of:

(g) subdividing a plurality of second connection devices into X groups of M second connection devices each, each second connection device being associated with a separate crosspoint area between each group of four first conductive lines of the plurality of parallel first conductive lines and a separate one of the M second conductive lines, each second connection device of a group of M second connection devices comprising a Positive Field Effect Transistor (PVT) and a Negative Field Effect Transistor (NFET);

(h) coupling a source electrode of each PVT to the first conductive line of the associated group of four first conductive lines which is coupled to the logical "1" potential, coupling a drain electrode of each PVT to a separate one of the associated one of the plurality of M parallel second conductive lines, and selectively coupling a gate electrode of each PVT to one of a group consisting of (a) the first conductive line coupled to the logical "1" potential for disabling the PVT, and (b) the second conductive line receiving the associated complementary true State signal for pulling down the first connection device coupled to the associated separate one of the associated plurality of M parallel second conductive lines; and (i) coupling a source electrode of each NFET to the fourth conductive line of the associated group of four first conductive lines which is coupled to the ground potential, coupling a drain electrode of each NFET to a separate one of the associated plurality of M parallel second conductive lines, and selectively coupling a gate electrode to one of a group consisting of (a) the fourth conductive line coupled to the ground potential for disabling the NFET, and (b) the third conductive line receiving the associated true state signal for pulling down the first connection device coupled to the associated separate one of the associated plurality of M parallel second conductive lines when the associated State of the state diagram is active, and no more than one of the associated PVT and NFET will be selectively made active in each second connection device.

* * * * *